United States Patent
McDonald et al.

(10) Patent No.: US 12,316,170 B2
(45) Date of Patent: May 27, 2025

(54) VARIABLE TORQUE GENERATION ELECTRIC MACHINE EMPLOYING TUNABLE HALBACH MAGNET ARRAY

(71) Applicant: Falcon Power, LLC, Titusville, FL (US)

(72) Inventors: Harley C. McDonald, Merritt Island, FL (US); James L. Bailey, Titusville, FL (US); Matthew C. McDonald, Merritt Island, FL (US)

(73) Assignee: Falcon Power, LLC, Titusville, FL (US)

( * ) Notice: Subject to any disclaimer, the term of this patent is extended or adjusted under 35 U.S.C. 154(b) by 0 days.

(21) Appl. No.: 18/359,601

(22) Filed: Jul. 26, 2023

(65) Prior Publication Data
US 2024/0030785 A1   Jan. 25, 2024

Related U.S. Application Data

(63) Continuation of application No. 18/068,184, filed on Dec. 19, 2022, now Pat. No. 11,750,070, which is a
(Continued)

(51) Int. Cl.
*H02K 11/28* (2016.01)
*H02K 1/16* (2006.01)
(Continued)

(52) U.S. Cl.
CPC ............... *H02K 11/28* (2016.01); *H02K 1/16* (2013.01); *H02K 1/20* (2013.01); *H02K 1/278* (2013.01);
(Continued)

(58) Field of Classification Search
CPC ........ H02K 33/00; H02K 35/02; H02K 35/00; H02K 35/04; H02K 3/26; H02K 15/02;
(Continued)

(56) References Cited

U.S. PATENT DOCUMENTS

| | | | | |
|---|---|---|---|---|
| 2,243,616 A | * | 5/1941 | Bing | H01F 7/0257 310/152 |
| 2,475,169 A | * | 7/1949 | Zahn | H02K 11/28 200/80 R |

(Continued)

FOREIGN PATENT DOCUMENTS

| CN | 109617319 A | 4/2019 |
|---|---|---|
| CN | 109995159 A | 7/2019 |

(Continued)

OTHER PUBLICATIONS

Jim Davis, Hot-swap controllers: A programmable approach, Feb. 8, 2011, EE Times, www.eetimes.com/hot-swap-controllers-a-programmable-approach/ accessed Jul. 27, 2023 (Year: 2011).
(Continued)

*Primary Examiner* — Maged M Almawri
(74) *Attorney, Agent, or Firm* — Kevin E. West; Advent, LLP

(57) ABSTRACT

An electric machine with variable torque generation having a tunable Halbach array configuration. The electric machine includes a magnet assembly for generating a magnetic field. The magnet assembly includes a plurality of fixed magnets disposed in a ring arrangement so that fixed magnets having a north pole faced toward the rotor or stator are alternated with fixed magnets having a south pole faced toward the rotor or stator, a plurality of rotatable magnets disposed within a respective slot formed between two adjacent fixed magnets, a drive assembly for turning the rotatable magnets within the slots to vary the magnetic field generated by the magnet assembly in the rotor or stator, the drive assembly configured to turn the rotatable magnets between a first position wherein the magnetic field in the rotor or stator is augmented and a second position wherein the magnetic field in the rotor or stator is cancelled.

20 Claims, 22 Drawing Sheets

Related U.S. Application Data continuation of application No. 17/190,362, filed on Mar. 2, 2021, now Pat. No. 11,532,971.

(60) Provisional application No. 63/077,243, filed on Sep. 11, 2020, provisional application No. 62/984,270, filed on Mar. 2, 2020.

(51) Int. Cl.
| | |
|---|---|
| *H02K 1/20* | (2006.01) |
| *H02K 1/278* | (2022.01) |
| *H02K 3/24* | (2006.01) |
| *H02K 5/20* | (2006.01) |
| *H02K 9/197* | (2006.01) |
| *H02K 29/03* | (2006.01) |
| *H03K 3/011* | (2006.01) |
| *H03K 17/687* | (2006.01) |
| *H05K 7/20* | (2006.01) |
| *H02K 5/10* | (2006.01) |

(52) U.S. Cl.
CPC ............... *H02K 3/24* (2013.01); *H02K 5/20* (2013.01); *H02K 9/197* (2013.01); *H02K 29/03* (2013.01); *H03K 3/011* (2013.01); *H03K 17/6871* (2013.01); *H05K 7/209* (2013.01); *H02K 5/10* (2013.01); *H02K 2213/03* (2013.01)

(58) Field of Classification Search
CPC ........ H02K 11/28; H02K 11/20; H02K 11/21; H02K 11/2155; H02K 11/22; H02K 11/225; H02K 11/23; H02K 11/24; H02K 11/25; H02K 11/26; H02K 11/27; H02K 1/22; H02K 1/27; H02K 1/2706; H02K 1/274; H02K 1/2746; H02K 1/2753; H02K 1/276; H02K 1/2766; H02K 1/2773; H02K 1/278; H02N 2/188; H03K 3/01; H03K 3/011; H03K 17/6871; H05K 7/209
USPC ..... 310/12.12, 12.15, 12.01, 67 A, 69, 68 A, 310/156.01, 156.47, 156.43, 156.07, 310/156.36, 156.38, 156.53, 156.56, 310/156.57
See application file for complete search history.

(56) References Cited

U.S. PATENT DOCUMENTS

| | | | | |
|---|---|---|---|---|
| 2,828,955 | A | * | 4/1958 | Murray .................... G01P 3/495 324/167 |
| 3,675,170 | A | * | 7/1972 | Wellman, Jr. ........... G01P 13/04 335/207 |
| 3,836,802 | A | * | 9/1974 | Parker .................... H02K 23/04 310/46 |
| 4,207,773 | A | * | 6/1980 | Stahovic ................ H02K 49/10 74/25 |
| 5,164,872 | A | | 11/1992 | Howell |
| 5,260,642 | A | * | 11/1993 | Huss ...................... H02K 21/14 322/51 |
| 5,855,256 | A | * | 1/1999 | Kuwahara ............ H02K 49/043 188/164 |
| 6,738,246 | B1 | | 5/2004 | Strümpler |
| 7,159,851 | B1 | | 1/2007 | Ross et al. |
| 7,453,341 | B1 | * | 11/2008 | Hildenbrand ......... H02K 26/00 310/46 |
| 7,605,570 | B2 | | 10/2009 | Liu et al. |
| 7,821,753 | B2 | | 10/2010 | Evans et al. |
| 8,145,312 | B2 | | 3/2012 | Wotherspoon |
| 9,076,607 | B2 | | 7/2015 | Premerlani et al. |
| 9,593,753 | B2 | * | 3/2017 | Davey .................... F16H 15/02 |
| 9,654,035 | B1 | | 5/2017 | Cieslewski et al. |
| 9,921,330 | B2 | | 3/2018 | Berglund |
| 10,320,272 | B1 | * | 6/2019 | Juarez .................... H02K 1/26 |
| 10,418,899 | B2 | | 9/2019 | Lui et al. |
| 10,581,287 | B2 | * | 3/2020 | Swales ................ H02K 1/2766 |
| 11,094,807 | B2 | | 8/2021 | Cattani et al. |
| 11,114,855 | B2 | | 9/2021 | Handelsman et al. |
| 11,251,622 | B1 | | 2/2022 | Sherwood et al. |
| 11,264,157 | B2 | * | 3/2022 | Choi .................... H01F 7/126 |
| 11,368,100 | B2 | | 6/2022 | Danforth, III et al. |
| 12,003,146 | B2 | | 6/2024 | McDonald |
| 2004/0183510 | A1 | | 9/2004 | Sutardja et al. |
| 2004/0251869 | A1 | | 12/2004 | Vadstrup |
| 2005/0140231 | A1 | * | 6/2005 | Ogoshi .................. H02K 53/00 290/1 A |
| 2010/0270804 | A1 | * | 10/2010 | Datel .................... F03D 13/20 290/55 |
| 2013/0019917 | A1 | | 1/2013 | Pal |
| 2013/0049509 | A1 | * | 2/2013 | Shin ...................... H02K 21/00 310/152 |
| 2013/0175894 | A1 | * | 7/2013 | Chen .................... H02K 21/24 310/114 |
| 2013/0207488 | A1 | * | 8/2013 | Labbe .................... H02K 23/58 310/43 |
| 2013/0234779 | A1 | | 9/2013 | Klug, Jr. |
| 2013/0342057 | A1 | * | 12/2013 | Fried .................... H02K 7/065 310/80 |
| 2014/0035412 | A1 | * | 2/2014 | Brewster ............ G01R 33/1215 310/90.5 |
| 2014/0070675 | A1 | * | 3/2014 | Linnebjerg ................ B62J 6/08 310/75 C |
| 2014/0117949 | A1 | | 5/2014 | Sadwick et al. |
| 2014/0313557 | A1 | * | 10/2014 | Brown ................ G02B 26/105 359/200.7 |
| 2014/0354089 | A1 | | 12/2014 | Chamberlin et al. |
| 2015/0048705 | A1 | * | 2/2015 | Davey .................... H02K 16/02 175/195 |
| 2015/0061437 | A1 | | 3/2015 | Hudec |
| 2015/0318851 | A1 | | 11/2015 | Roberts et al. |
| 2015/0349387 | A1 | | 12/2015 | Inaba et al. |
| 2016/0005519 | A1 | * | 1/2016 | Choi ...................... H01F 7/064 335/290 |
| 2016/0019917 | A1 | | 1/2016 | Du et al. |
| 2016/0036308 | A1 | * | 2/2016 | Bailey .................... B63H 21/20 310/91 |
| 2016/0164378 | A1 | | 6/2016 | Gauthier et al. |
| 2016/0301339 | A1 | * | 10/2016 | Ito .......................... H02K 11/33 |
| 2017/0160540 | A1 | * | 6/2017 | Giusti ................ H10N 30/2044 |
| 2017/0271954 | A1 | | 9/2017 | Hanumalagutti et al. |
| 2017/0282687 | A1 | | 10/2017 | Kalore et al. |
| 2018/0048255 | A1 | | 2/2018 | Marvin et al. |
| 2018/0205303 | A1 | * | 7/2018 | Del Curto ............. H02K 53/00 |
| 2018/0261412 | A1 | | 9/2018 | Schaper et al. |
| 2019/0158000 | A1 | | 5/2019 | Oelofse |
| 2019/0207447 | A1 | * | 7/2019 | Swales ................ H02K 1/2766 |
| 2020/0007000 | A1 | | 1/2020 | Berendes et al. |

FOREIGN PATENT DOCUMENTS

| | | |
|---|---|---|
| CN | 110176826 A | 8/2019 |
| DE | 4411055 A1 | 8/1995 |
| DE | 102012020958 A1 | 4/2014 |
| DE | 102015220852 A1 | 4/2017 |
| EP | 0224660 A1 | 6/1987 |
| EP | 0224660 B1 | 11/1989 |
| EP | 1271747 A1 | 1/2003 |
| EP | 1480327 B1 | 11/2007 |
| EP | 3252934 A1 | 12/2017 |
| EP | 3664262 A1 | 6/2020 |
| JP | 2005045984 A | 2/2005 |
| JP | 2007336670 A | 12/2007 |
| JP | 2010213413 A | 9/2010 |
| JP | 2010263725 A | 11/2010 |
| JP | 2013509855 A | 3/2013 |
| JP | 2018126052 A | 8/2018 |
| JP | 2019126172 A | 7/2019 |
| KR | 20080070161 A | 7/2008 |
| KR | 20090049188 A | 5/2009 |

(56) References Cited

FOREIGN PATENT DOCUMENTS

| | | |
|---|---|---|
| KR | 20120056623 A | 6/2012 |
| KR | 20120067855 A | 6/2012 |
| KR | 20170060055 A | 5/2017 |
| KR | 20180004139 A | 1/2018 |
| KR | 20180041039 A | 4/2018 |
| RU | 2543993 C2 | 3/2015 |
| TW | 200719808 A | 5/2007 |
| TW | 201230626 A | 7/2012 |
| TW | 201328140 A | 7/2013 |
| TW | 201330455 A | 7/2013 |
| TW | 201601420 A | 1/2016 |
| TW | 201824708 A | 7/2018 |
| WO | 2009137326 A1 | 11/2009 |
| WO | 2011099603 A1 | 8/2011 |
| WO | 2015126981 A1 | 8/2015 |
| WO | 2017018578 A1 | 2/2017 |

OTHER PUBLICATIONS

Matsui, N., "Design and Control of Variable Field Permanent Magnet Motors," IEEJ Transactions on Electrical and Electronic Engineering, IEEJ Trans 2019, 14, pp. 966-981.

PCT International Search Report and Written Opinion for PCT/US2021/020558, dated Jun. 24, 2021.

PCT International Search Report and Written Opinion forPCT/US2021/020562, dated Jun. 28, 2021.

PCT International Search Report and Written Opinionfor PCT/US2021/010008, dated Jun. 29, 2021.

PCT InternationalSearch Report and Written Opinion for PCT/US2021/020559, dated Jun. 29, 2021.

PCTInternational Search Report and Written Opinion for PCT/US2021/010006, dated Jun. 28, 2021.

Extended European Search Report from European Application No. 21764516.7, dated Apr. 5, 2024.

Extended European Search Report and Written Opinion from App. No. EP21763593, dated Apr. 29, 2024.

Office Action from Taiwanese Application No. 110107336, dated Oct. 1, 2024.

Office Action from Taiwanese Application No. 110107393, dated Oct. 1, 2024.

Notice of Preliminary Rejection for Korean Application No. 10-2022-7033524, dated Mar. 24, 2025.

Notice of Reasons for Rejection for Japanese Patent Application No. 2022-552520, dated Mar. 18, 2025.

Notice of Reason(s) for Rejection for Japanese Patent Application No. 2022-552523, dated Jan. 17, 2025.

Office Action from Taiwanese Application No. 110107388, dated Mar. 4, 2025.

\* cited by examiner

VARIABLE TORQUE GENERATION ELECTRIC MACHINE EMPLOYING TUNABLE HALBACH MAGNET ARRAY

CROSS-REFERENCE TO RELATED APPLICATIONS

The present application is a continuation of U.S. application Ser. No. 18/068,184, now U.S. Pat. No. 11,750,070, filed Dec. 19, 2022, and titled "VARIABLE TORQUE GENERATION ELECTRIC MACHINE EMPLOYING TUNABLE HALBACH MAGNET ARRAY", which is a continuation of U.S. application Ser. No. 17/190,362, now U.S. Pat. No. 11,532,971, filed Mar. 2, 2021 and titled "VARIABLE TORQUE GENERATION ELECTRIC MACHINE EMPLOYING TUNABLE HALBACH MAGNET ARRAY" and which claims priority under 35 U.S.C. § 119(e) of U.S. Provisional Application Ser. No. 62/984,270, filed Mar. 2, 2020, and titled "Variable Torque Generation Electric Machine Employing Tunable Halbach Magnet Array." U.S. Pat. No. 11,532,971 also claimed priority under 35 U.S.C § 119(e) of U.S. Provisional application Ser. No. 63/077,243, filed Sep. 11, 2020, and titled "Cascade Mosfet Design for Variable Torque Generator/Motor Gear Switching." U.S. application Ser. No. 17/190,362, U.S. application Ser. No. 17/190,354 titled "Cascade Mosfet Design for Variable Torque Generator/Motor Gear Switching" filed Mar. 2, 2021, and U.S. application Ser. No. 17/190,347 titled "Cooling System for Variable Torque Generation Electric Machine" filed Mar. 2, 2021 are herein incorporated by reference in their entireties.

BACKGROUND

Electric machines are devices that use electromagnetic forces to convert electrical energy to mechanical energy or mechanical energy to electrical energy. Common electric machines include electric generators and electric motors.

Electric generators convert mechanical energy into electrical energy for use in an external circuit such as a power grid, an electrical system in a vehicle, and so forth. Most generators employ a motive power source in the form a rotary force (torque) such as the rotation of a shaft. The rotary force causes electric current to be generated in one or more wire windings through interaction between magnetic fields created by magnets within the generator and the wire windings. Common sources of motive power include steam turbines, gas turbines, hydroelectric turbines, internal combustion engines, and the like, which have a constant torque and continuous rotational speed, expressed in Revolutions Per Minute (RPM).

Electric motors are mechanically identical to electric generators but operate in reverse. Electric motors convert electrical energy into mechanical energy through the interaction between magnetic fields created by magnets within the motor and electric current passing through one or more wire windings to generate a motive force in the form of rotation of the motor's shaft (i.e., a rotary force or torque). This rotary force (torque) is then used to propel some external mechanism. Electric motors are generally designed to provide continuous rotation and constant torque. In certain applications, such as in vehicles employing regenerative braking with traction motors, electric motors can be used in reverse as generators to recover energy that might otherwise be lost as heat and friction.

Increasingly, electric generators employed in renewable energy technologies must operate at rotational speeds (RPM) and torque that vary widely because the power sources used are variable, untimely, and often unpredictable. Similarly, electric motors employed by environmentally friendly or green technologies must be capable of producing a range of rotational speeds (RPM) and torques. However, while conventional electric generators and motors often demonstrate efficiencies ranging from ninety to ninety-eight percent (90%-98%) when operating near their rated rotational speed (RPM)) and torque, the efficiencies of these same generators and motors decreases dramatically, often as low as thirty to sixty percent (30%-60%) when they are operating outside of their rated rotational speed (RPM) and/or torque.

DRAWINGS

The Detailed Description is described with reference to the accompanying figures. The use of the same reference numbers in different instances in the description and the figures may indicate similar or identical items. Additionally, it will be appreciated by those of ordinary skill in the art that the concepts disclosed herein may be applied to various kinds of electric machines including, but not limited to, electric motors, electric generators, and/or electromechanical transmission systems. Thus, throughout this disclosure and in the claims that follow, the term electric machine is used generally to describe any electromechanical device capable of employing the concepts described herein, and it should be appreciated that, unless otherwise so stated, that the term electric machine may refer to an electric motor, an electric generator, an electromechanical transmission system, combinations thereof (e.g., an electric machine may comprise a motor/generator suitable for use in a hybrid vehicle employing regenerative braking), and so forth.

Figure 15:
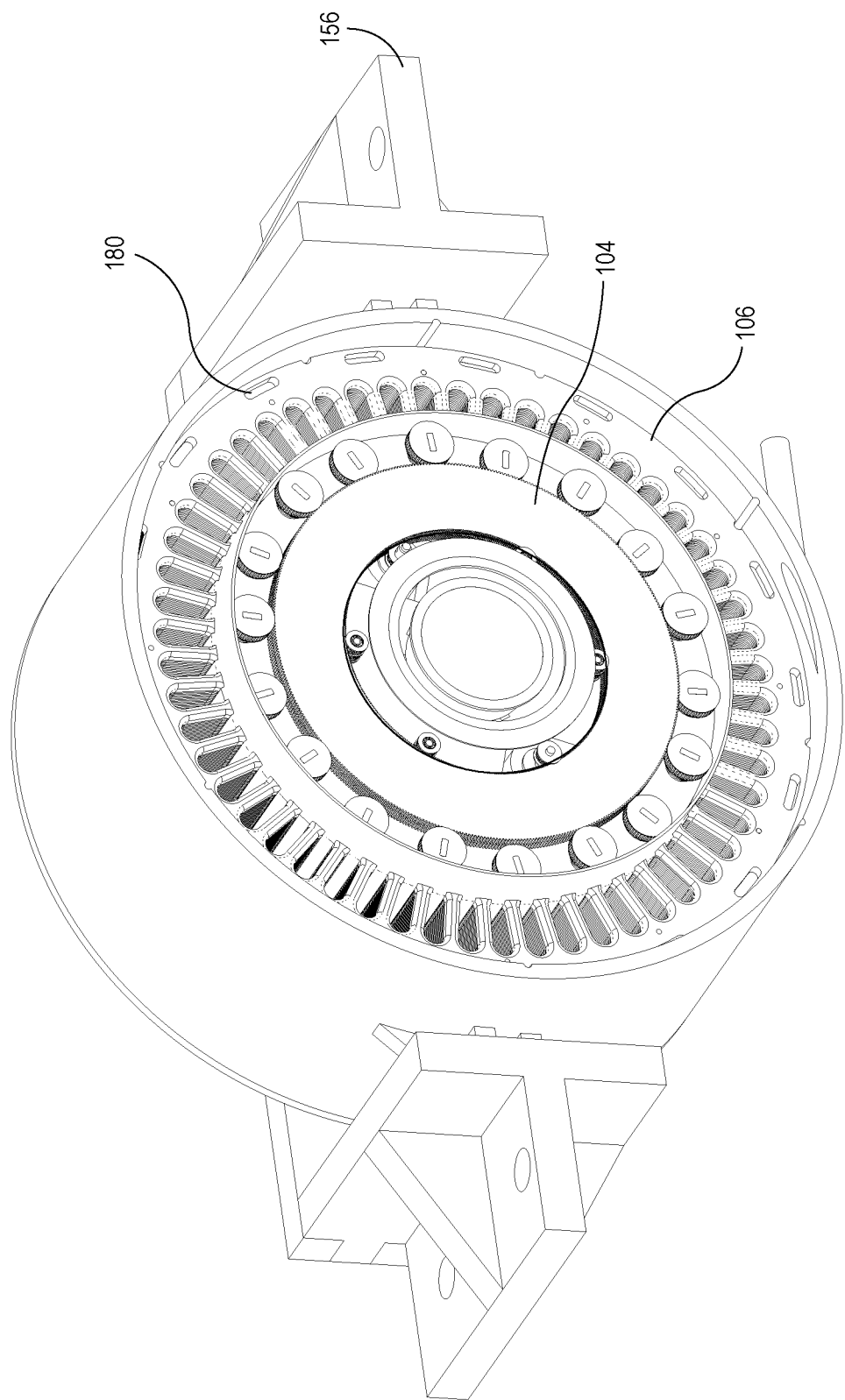
FIG. 15 is cross-sectional perspective view of the electric machine shown in FIG. 13, the electric machine having a housing, a rotor assembly, a stator assembly and a main axle, in accordance with an example embodiment of the present disclosure.
Figure 16:
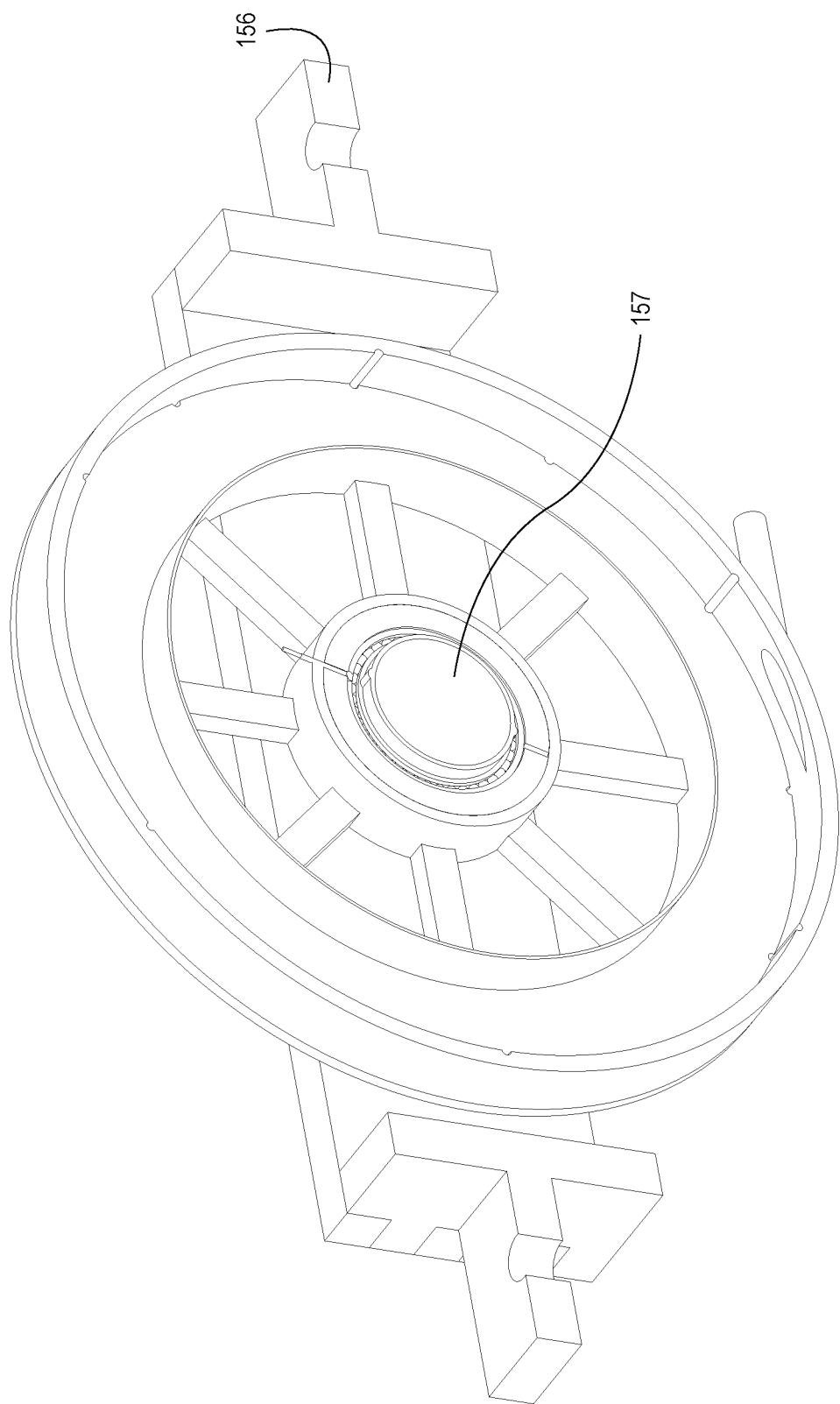
FIG. 16 is a perspective view of an end cap of the axle shown in FIG. 13 in accordance with an example embodiment of the present disclosure.
Figure 21:
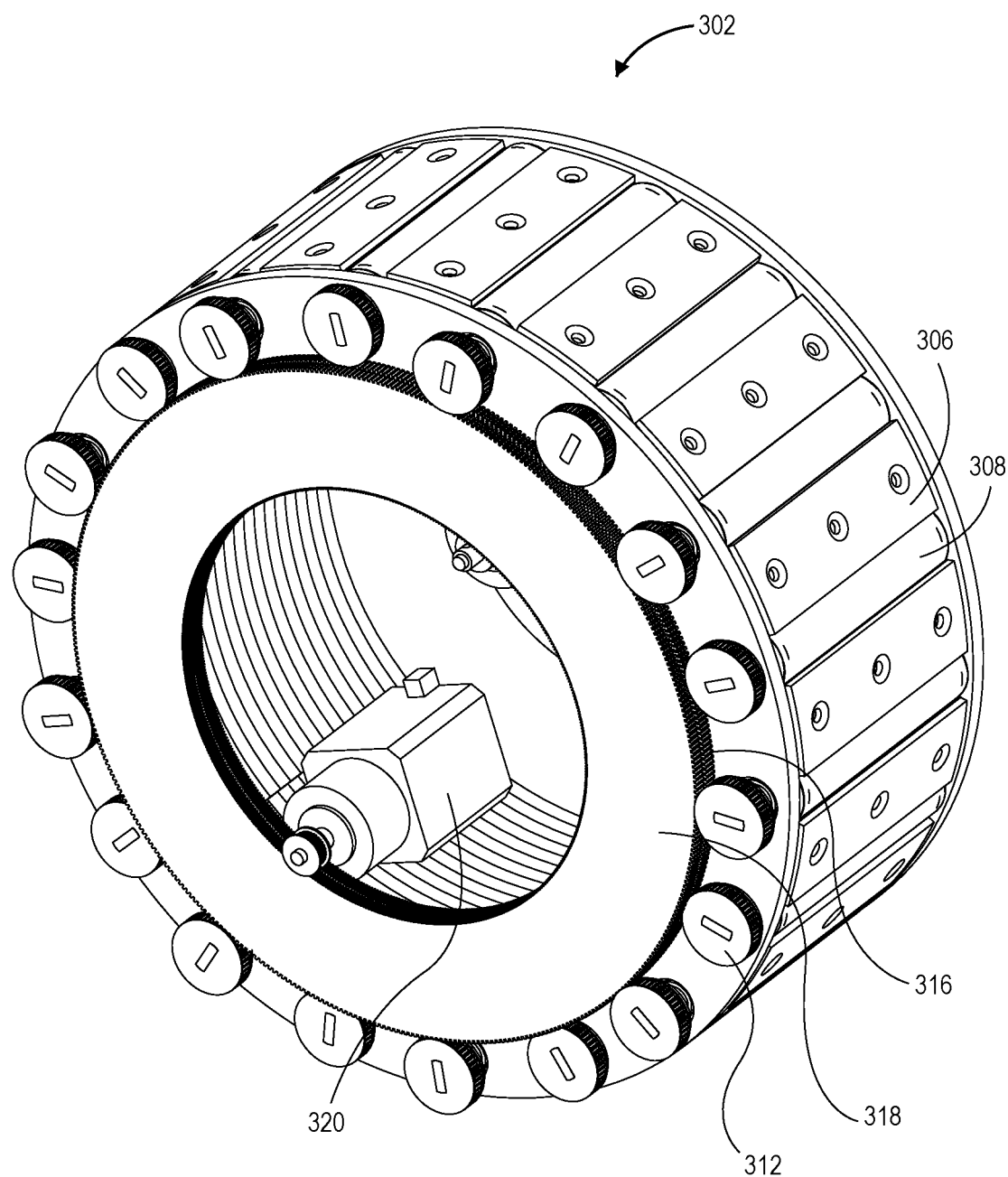
Figure 22:
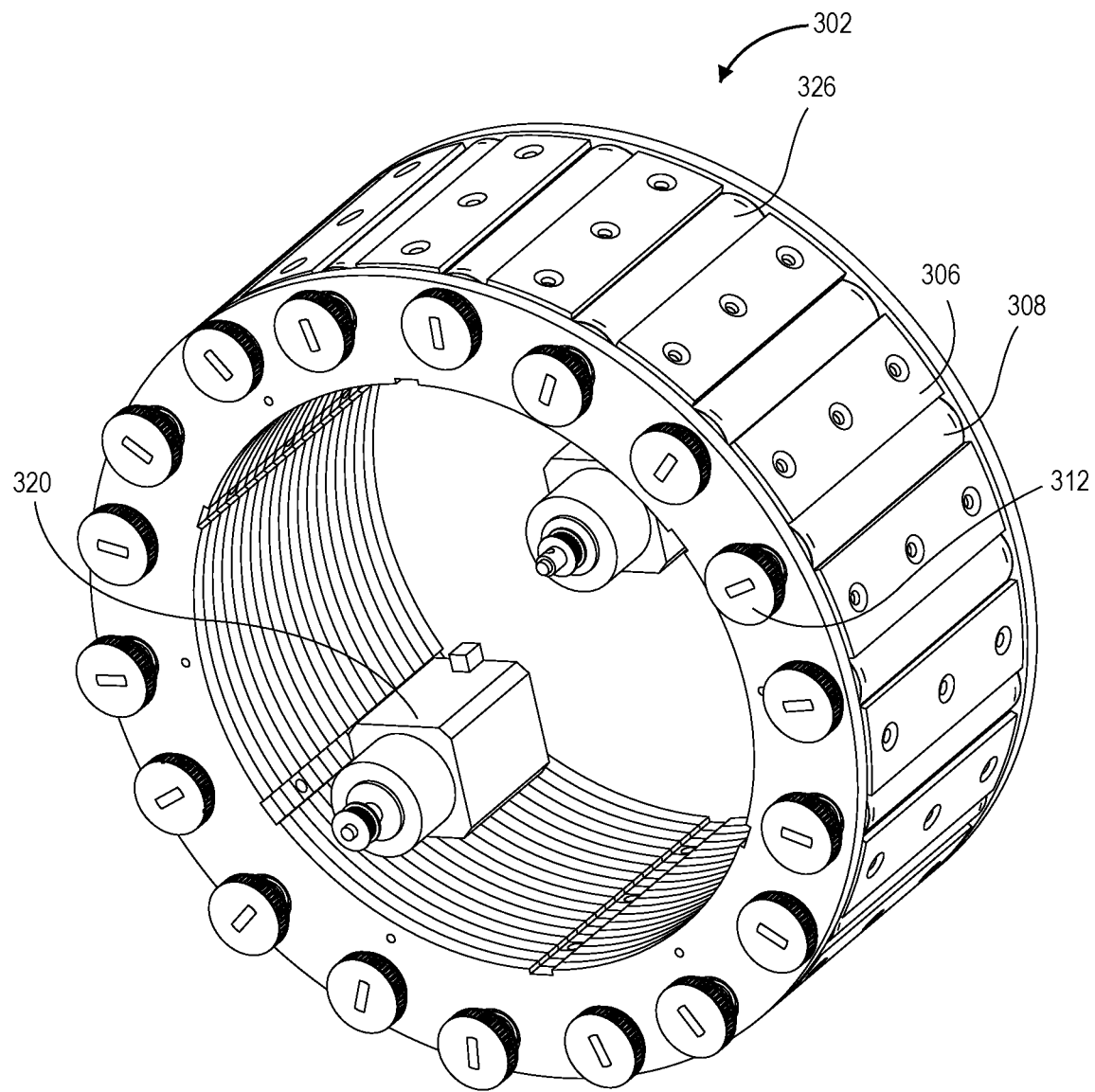

FIG. 21 is a perspective view of the rotor assembly shown in FIG. 15, showing a magnet assembly and drive assembly to rotate rotatable magnets within the magnet assembly in accordance with example embodiments of the present disclosure; and FIG. 22 is a perspective view of the rotor assembly shown in FIG. 15, showing a magnet assembly configured in a Halbach array, in accordance with example embodiments of the present disclosure;

DETAILED DESCRIPTION

Overview

Although the subject matter has been described in language specific to structural features and/or process operations, it is to be understood that the subject matter defined in the appended claims is not necessarily limited to the specific features or acts described above. Rather, the specific features and acts described above are disclosed as example forms of implementing the claims.

The Detailed Description is described with reference to the accompanying figures. The use of the same reference numbers in different instances in the description and the figures may indicate similar or identical items. Additionally, it will be appreciated by those of ordinary skill in the art that the concepts disclosed herein may be applied to various kinds of electric machines including, but not limited to, electric motors, electric generators, and/or electromechanical transmission systems. Thus, throughout this disclosure and in the claims that follow, the term electric machine is used generally to describe any electromechanical device capable of employing the concepts described herein, and it should be appreciated that, unless otherwise so stated, that the term electric machine may refer to an electric motor, an electric generator, an electromechanical transmission system, combinations thereof (e.g., an electric machine may comprise a motor/generator suitable for use in a hybrid vehicle employing regenerative braking, a generator suitable for a wind turbine, etc.), and so forth.

Motors and generators are designed for operation at a specific rotatable speed and torque with a very narrow range of optimum efficiency High torque requirements in a motor or generator demand more powerful permanent magnets which in turn create a large back Electromotive Force (EMF) that is in turn overcome with high voltage and current. When rotatable speed and torque are constant, the motor or generator can be designed for optimum efficiency. Often, this efficiency can be well above ninety percent (90%). Thus, in the design and manufacture of such motors and generators, the stator core, core windings and permanent magnets are all selected to act together, to produce the required torque, rotatable speed (RPM), voltage, and current ratios at an optimum or threshold efficiency. Once these key components are selected and placed in the motor or generator, they cannot be changed. Only the power and speed of the driving force in a generator or the voltage and amperage of the electric current into the motor can be changed. However, when such motors or generators are put in service where the speed and torque vary widely such as in land vehicles and/or wind or water powered generators, the back EMF of the fixed magnets must still be overcome when the speed and torque requirements are less than the maximum designed for and the stator wiring sufficient and appropriately sized when the speed and torque are greater than the maximum designed for. When they are not, the overall efficiency of the motor or generator dramatically drops in many cases to as low as twenty percent (20%) for electric or hybrid vehicles, wind or water powered generators, and the like.

The present disclosure is directed to variable torque generation (VTG) electric motors, electric generators and/or transmission systems that are capable of operating with high efficiency under wide voltage and amperage operating ranges and/or extremely variable torque and rotatable speed (RPM) conditions. Electric motors in accordance with the present disclosure, are well suited for use in technologies were motors produce variable torque and/or rotatable speed (RPM). Similarly, electric generators in accordance with the present disclosure are well suited for use in technologies were variable torque and rotatable speed (RPM) conditions are common such as where variable environmental conditions such as inconsistent wind speed, untimely ocean wave movement, variable braking energy in a hybrid vehicle, and so forth, are frequently encountered. Example technologies may include, for example, technologies employing renewable energy resources including wind power, hydroelectric power, electric or hybrid vehicles, and so forth.

As previously discussed, the magnetic field of a rotor in permanent magnet electric motors and generators is not adjustable but fixed. The alternating flow of magnetic flux between the permanent magnets of the rotor and the cores of the stator and the alternating flow of electricity in the wires of the stator core that determine how a permanent magnet motor or generator will operate. Where there is a small amount of magnetic flux flowing between the rotor magnets and the stator core, it is as if the rotor of the motor or generator was fitted with small or lower strength permanent magnets. If the amount of flux flowing between the rotor magnets and the stator core is large, the reverse is true, the strength of the permanent magnets in the rotor of the motor or generator is higher. When small permanent magnets are used in the rotor of a motor, the wires in the stator core coils are sized with the requisite number of turns to produce a magnetic field in the stator teeth (or cores) that will efficiently react with the magnetic field of the rotor magnets to produce the optimum (or nearly optimum) flux flow between the rotor and the stator and optimum (or nearly optimum) torque or rpm. In the case of a generator, the wires are sized with the requisite number of turns to efficiently accommodate the electricity generated by the alternating flux induced in the stator cores by the permanent magnets on the rotating rotor. Motors and generators may have a different number of wire windings even if the size of their respective permanent magnets is the same. The wires and number of turns in a large permanent magnet rotor is different from the wires and number of turns in a small permanent magnet rotor, and the size of the output of the two rotors is significantly different.

The techniques described herein can dynamically change the output "size" of an electric machine such as a motor, a generator, a transmission, or the like, by one or more of varying the magnetic field induced in the stator by switching multiple non-twisted parallel coil wires in the stator between being connected in all series, all parallel, or combinations thereof, and correspondingly tuning (e.g., varying, adjusting, or focusing) the magnetic field of the permanent magnets acting on the stator using a tunable Halbach magnet arrangement in the rotor. The tunable Halbach magnet arrangement is comprised of interspersed fixed and rotatable magnets, which may be rotated to tune the magnetic field strength of the magnet array. Additionally, as torque/RPM or amperage/voltage requirements change, the system can activate one stator or another (in multiple electric machine units connected to a common computer processor) within the rotor/stator sets and change from parallel to series winding or the reverse through sets of two (2), four (4), six (6), or more parallel, three phase, non-twisted coil windings. In this manner, the system can meet the torque/RPM or amperage/voltage requirements of the electric machine while improving (e.g., increasing, optimizing, or nearly optimizing) its efficiency.

This disclosure provides systems and methods for adjusting the magnetic field of the permanent magnet rotor in an electric machine such as an electric motor, generator, or transmission. It does so by employing a tunable Halbach magnet array configuration for tuning (e.g., varying, adjusting, and/or focusing) the magnetic field acting on the stator cores to meet the torque and speed (RPM) requirements of the electric machine at any given time. By reducing or increasing the magnetic field acting on the stator core, the present techniques respectively reduce or increase the back EMF. For example, in the case when the electric machine is a motor, a reduction or an increase of back EMF may result in using lower or higher voltage and amperage (power) to run the motor. If in another example, the electric machine is a generator, varying the back EMF of the magnetic field would vary the torque (e.g., wind speed) needed to turn the generator. The present disclosure allows the system employing the electric machine to adjust the back EMF to meet varying conditions and operate the electric machine at a greater efficiency over much wider ranges of torque than ever before possible. With these capabilities, the electric machine can control the strength of the interaction of the magnetic fields of both the rotor(s) and the stator over a relatively uniform range of variable power requirements with high efficiency. The efficiency of any electric motor is dependent on the balance between the electromagnetic field of the stator and the electromagnetic field of the rotor interacting with the stator. The inverter/controller in the electric machine can regulate the voltage coming from an electrical source, such as a battery or other electrical source, which in turn regulates the amperage in the stator coil wires within the capacity of the wires and voltage source. The electric machine can switch between different wiring combinations, each wiring combination having a different resistance. Each different resistance of the wiring combinations creates a different range of amperage turns, as the inverter/controller in a computer processor increases the voltage in each wiring configuration from low to high. The different wiring configurations are then configured, combined, and coordinated with the voltage regulation so that the overall range of the amperage flowing in the stator coils can be uniformly regulated (increased or decreased) over a greatly extended range as the computer processor switches the wiring from one configuration to the next correspondingly changing the value of the turns in the stator coils and the resulting magnetic field strength. With the ability of the electric machine to focus or control the magnetic field of the rotor magnets interacting with the stator coils over a much larger range from low to high by the movement of the rotor or rotors with respect to the stator, the computer processor may be configured to tune the magnetic field of the rotor with respect to the stator a function of the turns in the stator coils so that the rotor is tuned to provide the optimum efficiency or balance between the magnetic fields of the stator coils and the rotor permanent magnets.

Changing the wiring and number of turns to modify the flux of a stator core and the electricity flowing in a core coil wires is not as easy to adjust or vary as changing the flux flowing from the rotor permanent magnets. This can be accomplished by separating the multi-phase stator wiring at a center tap or the three legs of a delta configuration and providing multiple non-twisted parallel wires in the core windings for each phase leg (and in some cases with wires of different size) with the ability to switch and connect the multiple wires in all series, all parallel, and combinations of parallel and series configurations. In some implementations, one or more wires may be disconnected to provide additional configurations (e.g., dropping from a six-wire system to a four-wire system, or the like). In some implementations, the phase windings are also switchable from a star or WYE (Y) configuration to a delta (e.g., triangle) configuration. In some implementations, the system can provide two separate multi-phase wiring configurations with separate controllers on the same stator, and in some implementations separating the coils in each phase leg (including the multiple wires therein) so that any of the stator phases in either separate multi-phase configuration can be switched (e.g., using electronic switches) to be connected in series, in parallel, or in combinations thereof, in either the star (Y) or Delta configuration.

In embodiments, an electric machine can also be provided by joining together a plurality of modular electric machine units (e.g., each having respective stator(s) and rotor(s)) to vary the overall system output. For example, the electric machine units can be joined together under common control from a central processor where they may operate together for increased power or at least one can operate while another is in neutral. The electric machine units may also be configured to shift back and forth between the different series, parallel, or combination (i.e., series and parallel) wiring and switching combinations to provide smooth transitions between the various combinations. The electric machine units can also be shifted back and forth between Delta or Star phase configurations with series/parallel switching of the multiple wires in each phase.

In embodiments of this disclosure, any single electric machine unit may have any or all of the combinations of multiple wiring and switching described herein, including switching between Delta and WYE configurations, multiple wire windings in series or parallel or in sets of two or more wires in parallel connected to each other in series, and where the electric machine is multi-pole, the individual coils of a phase winding may be connected in series or parallel or in sets of two or more coils in parallel connected to each other in series, providing a wide range of voltage/amperage and torque/speed ratios in a single electric machine that is electronically reconfigurable to meet widely varying conditions. This feature coupled with an electronic shifting of the rotor magnetic field and the ability to focus the magnetic field of the rotor on the stator cores, provides an ability through a computer system processor to select and quickly change the winding configuration of the stator to meet widely variable speed and torque requirements that may be placed on the electric machine at optimum (or near optimum or otherwise selected) energy efficiency.

The electric machine of the present disclosure may further include a cooling system. The cooling system allows to incrementally reduce the resistance of stator coils using the series and parallel switching to increase the amperage in the coils without baring significant losses. Cooling the wires will allow the wires to carry more amperage by as much as five times their rated capacity. In comparison to a conventional motor or generator with a single conductor per phase, a cooled conventional electric machine may have its power increased through cooling by as much as five times, where the electric machine may have its power increased by as much as 30 times.

The cooling system of the present disclosure may include a sealed stator core and coil fluid cavity with circulating cooling fluid, tubing for circulating water or different fluid to reduce the temperature of the cooling fluid circulated within the fluid cavity, thermoelectric devices, such as Peltier devices, in contact with the cooling fluid.

DETAILED DESCRIPTION OF EXAMPLE EMBODIMENTS

FIGS. 1 through 21 illustrate an electric machine having a rotor employing a tunable Halbach array configuration in accordance with the present disclosure. The Halbach array configuration allows the flux of the permanent magnets in the electric machine to be tuned (e.g., varied, adjusted, focused, etc.) to vary the induction of electricity in the coils in controlled increments from maximum amperage and/or voltage to zero or near zero amperage and/or voltage. The electric machine comprises a housing, a stator, and at least one rotor. The at least one rotor includes a circular Halbach array of magnets, comprising fixed magnets having a semi-hourglass shape or cross-section (e.g., an I-shaped cross-section), and rotatable magnets having a cylindrical (round) shape or cross-section, wherein the rotatable magnets are disposed between slots provided between adjacent ones of the fixed magnets. The fixed magnets are mounted to a stator core around the periphery of the stator core and are positioned by placing alternating adjacent north poles and south poles facing outwards towards the stator. The rotatable magnets are diametrically magnetized. A minimal uniform clearance is provided between the interior walls of the fixed magnets and outer walls of the rotatable magnets. The interior walls of the fixed magnets may be coated with a friction-reducing coating such as a Teflon™ or Delrin™ type material or other polymers that reduce friction between surfaces.

Referring generally to FIGS. 1 through 5, an electric machine 100 is described in accordance with an embodiment of this disclosure. As noted herein above, the term electric machine may refer to an electric motor, an electric generator, a transmission system, combinations thereof, and so forth.

Figure 1:
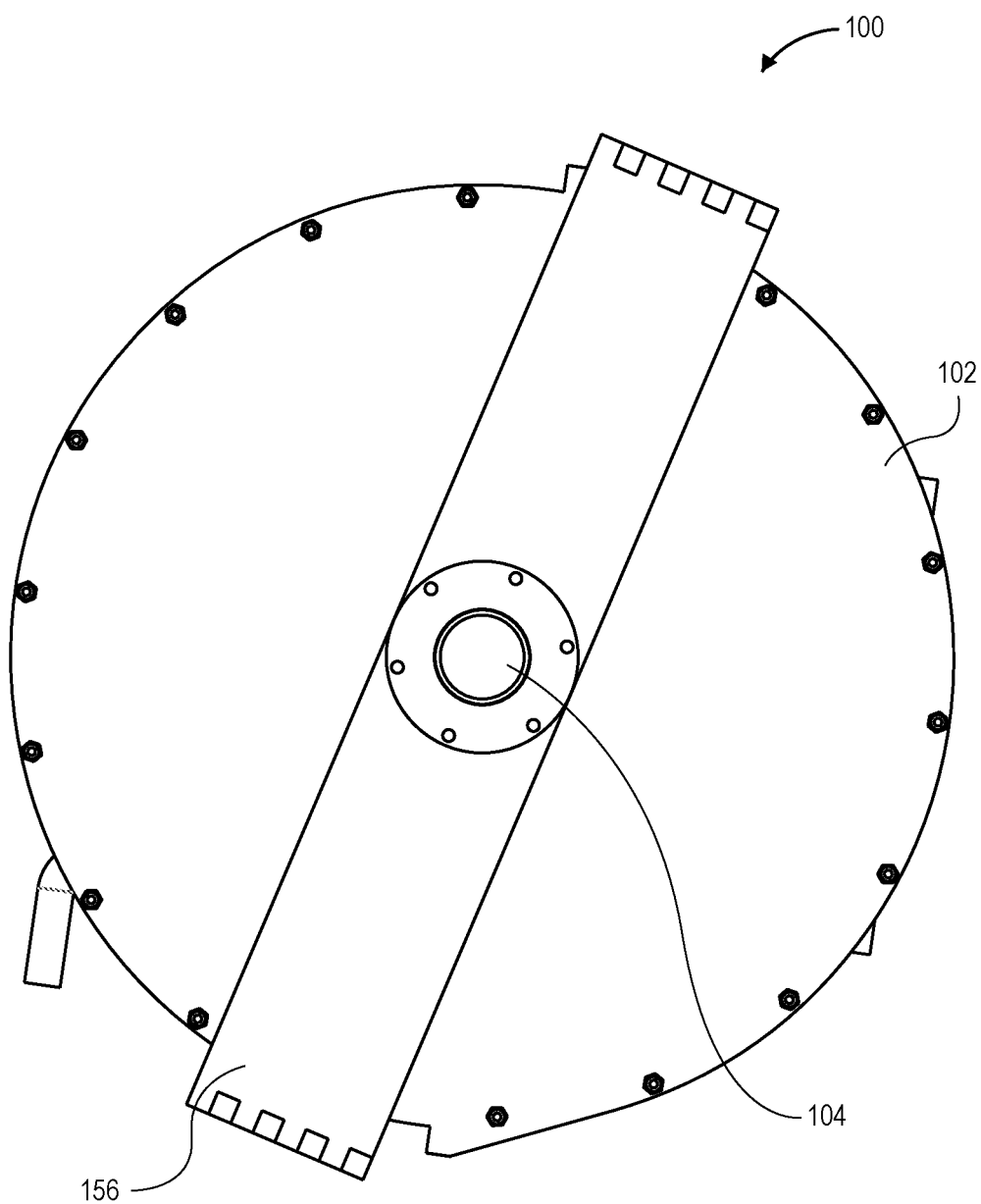
FIG. 1 is a side view illustrating an electric machine, in accordance with an example embodiment of the present disclosure.
Figure 2:
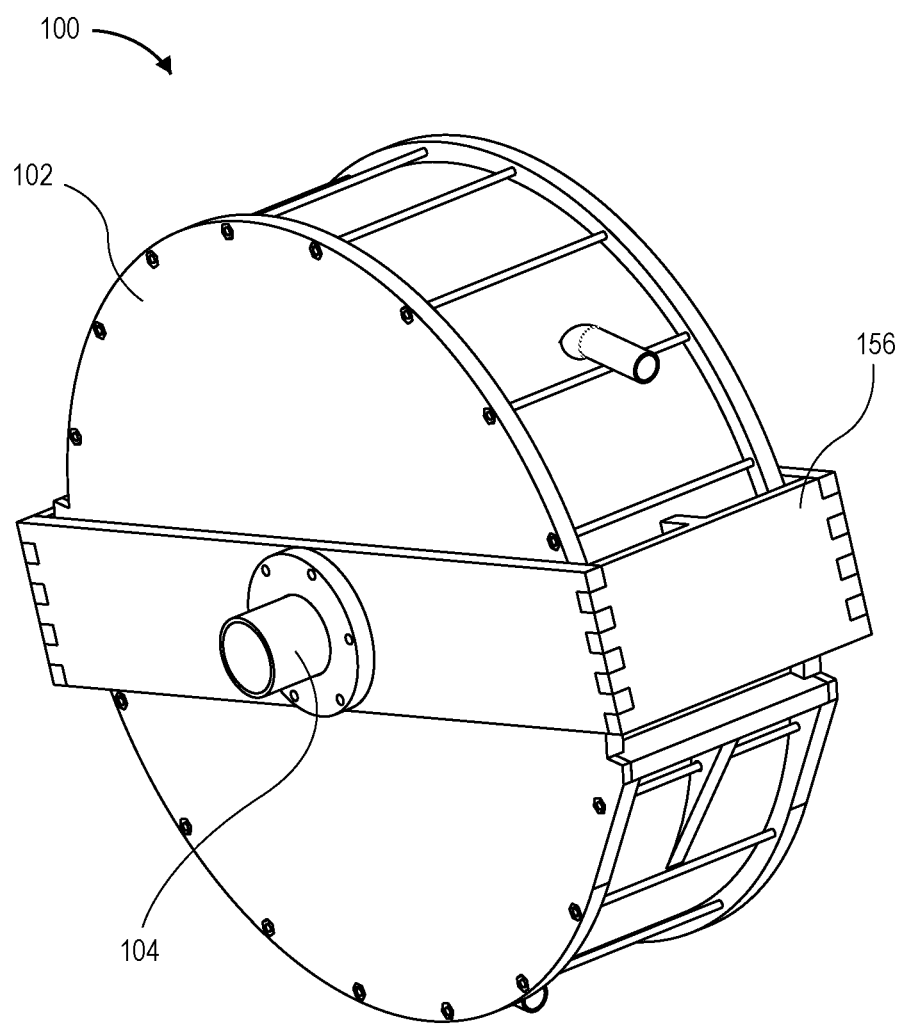
FIG. 2 is a perspective view illustrating of the electric machine shown in FIG. 1, in accordance with an example embodiment of the present disclosure.
Figure 3:
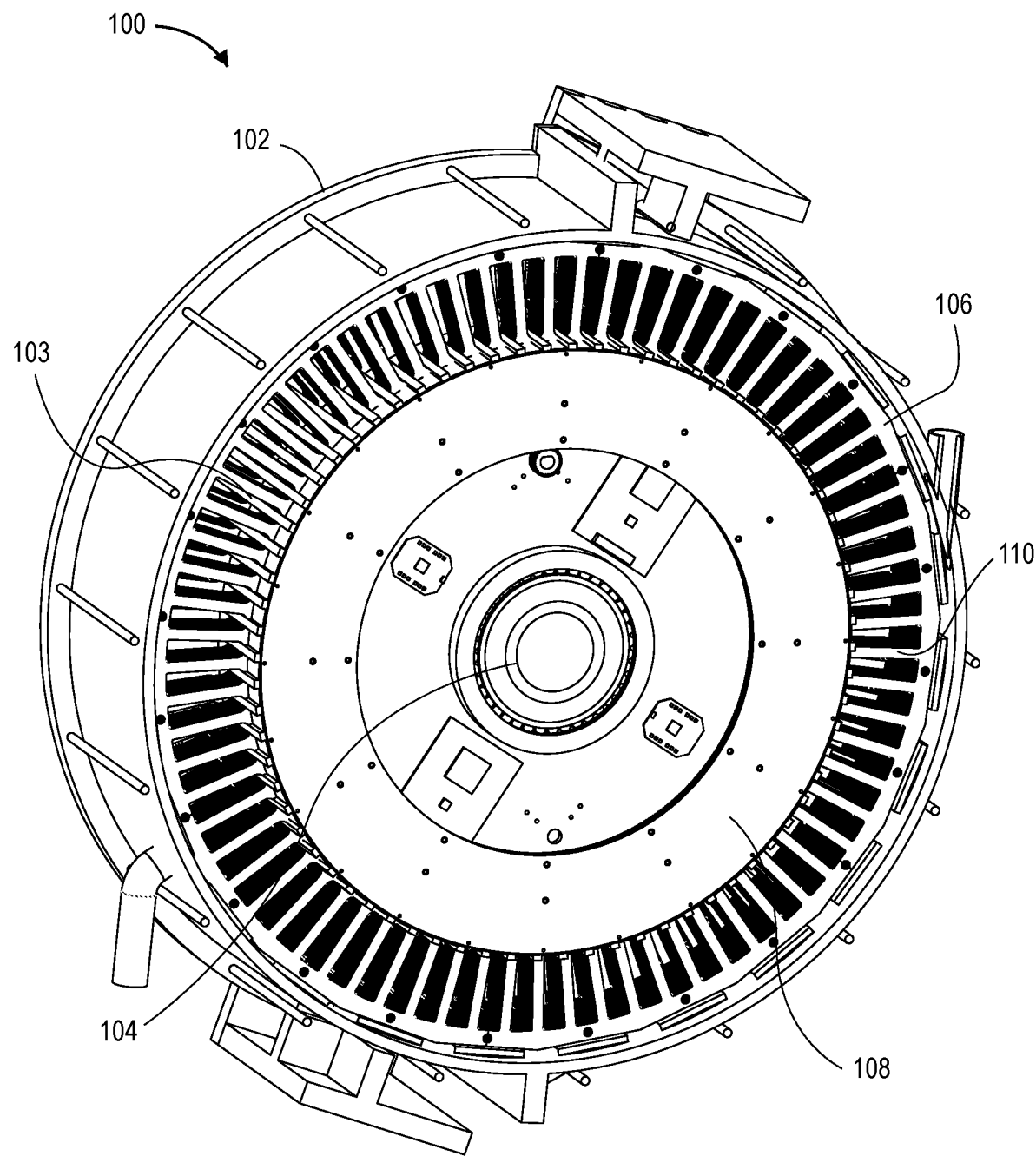
FIG. 3 is a cross-sectional perspective view of the electric machine shown in FIG. 1, the electric machine having a housing, a rotor assembly, a stator assembly and a main axle, in accordance with an example embodiment of the present disclosure.
Figure 4:
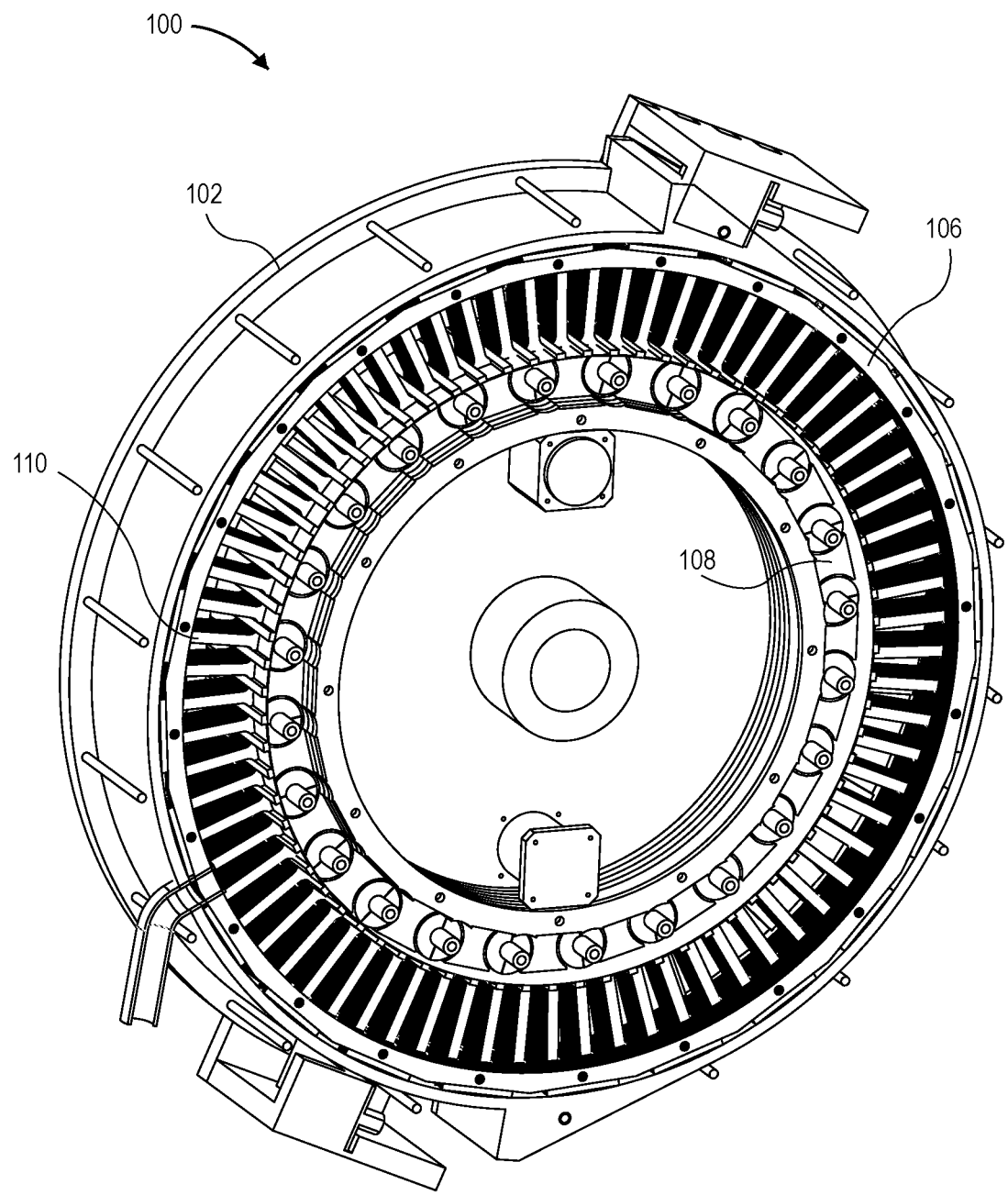
FIG. 4 shows a further cross-sectional perspective view of the electric machine shown in FIG. 3, showing the rotor assembly having a Halbach configuration in accordance with example embodiments of the present disclosure.
Figure 5:
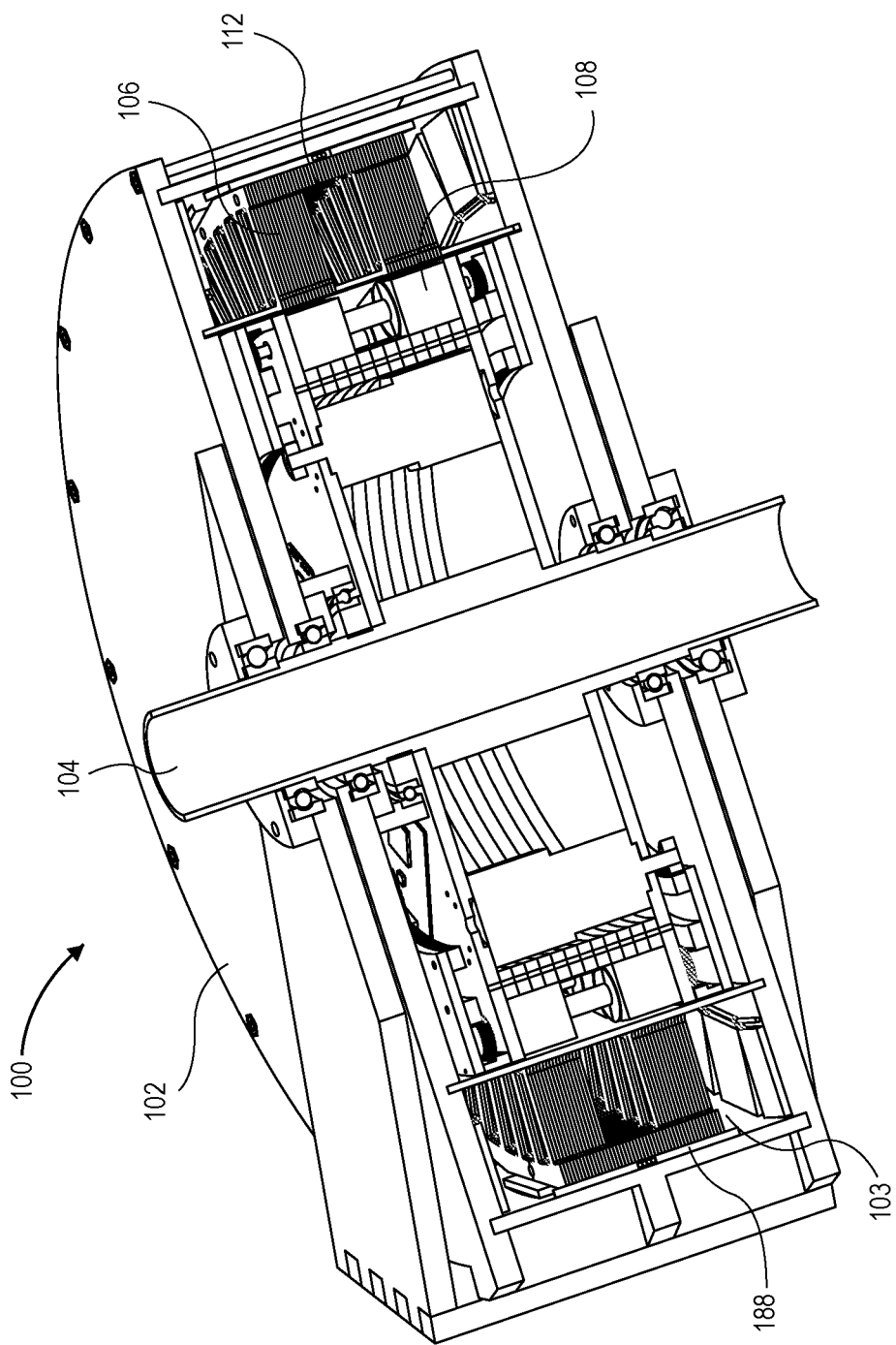
FIG. 5 shows a different cross-sectional perspective view of the electric machine shown in FIG. 2 parallel to the main axis, showing the stator assembly and the rotor assembly in accordance with an example embodiment of the present disclosure.
Figure 6:
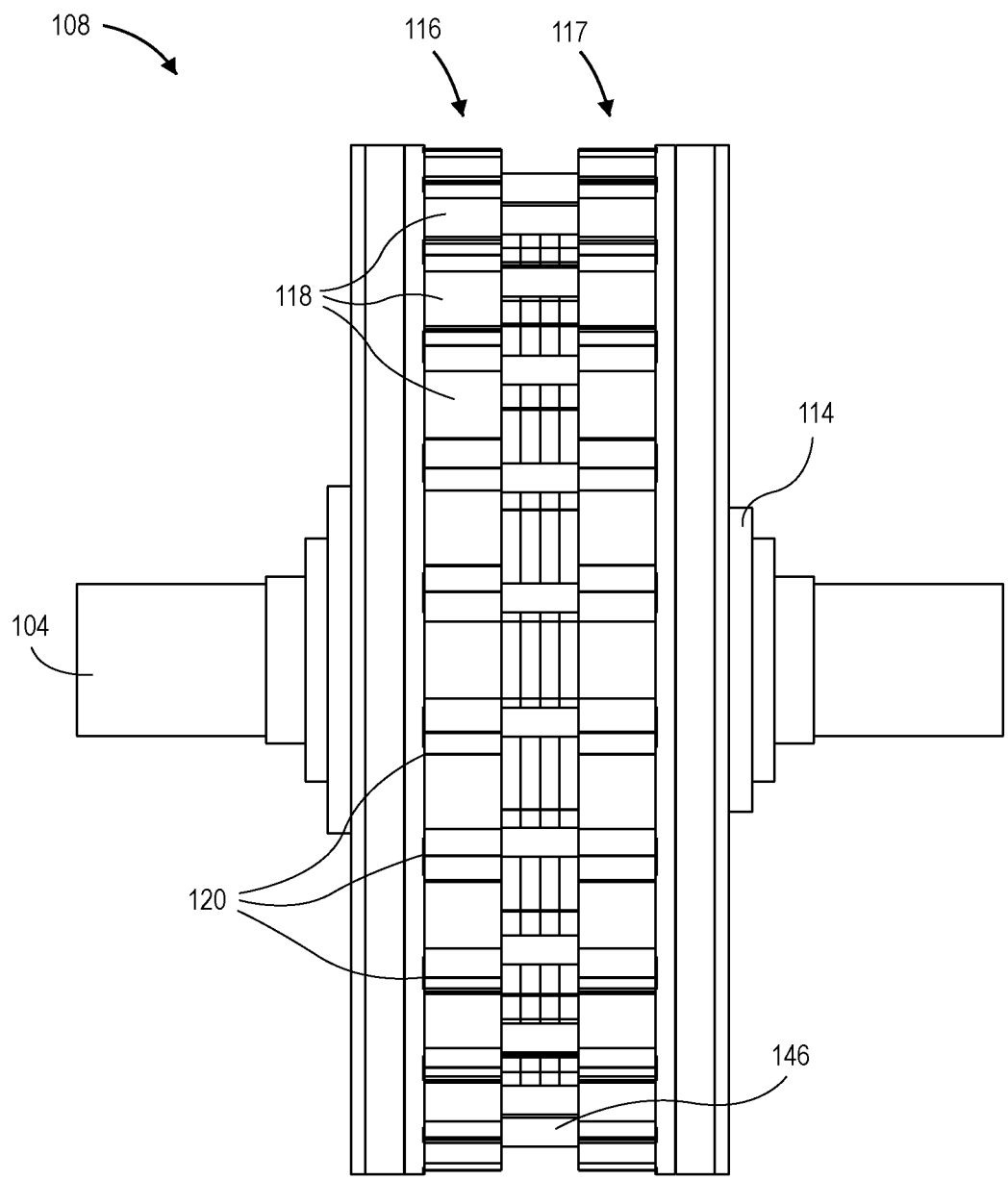
FIG. 6 is a side view illustrating the rotor assembly of the electric machine in FIG. 5, arranged in a Halbach array having two sets of rotatable magnets, in accordance with an example embodiment of the present disclosure.
Figure 7:
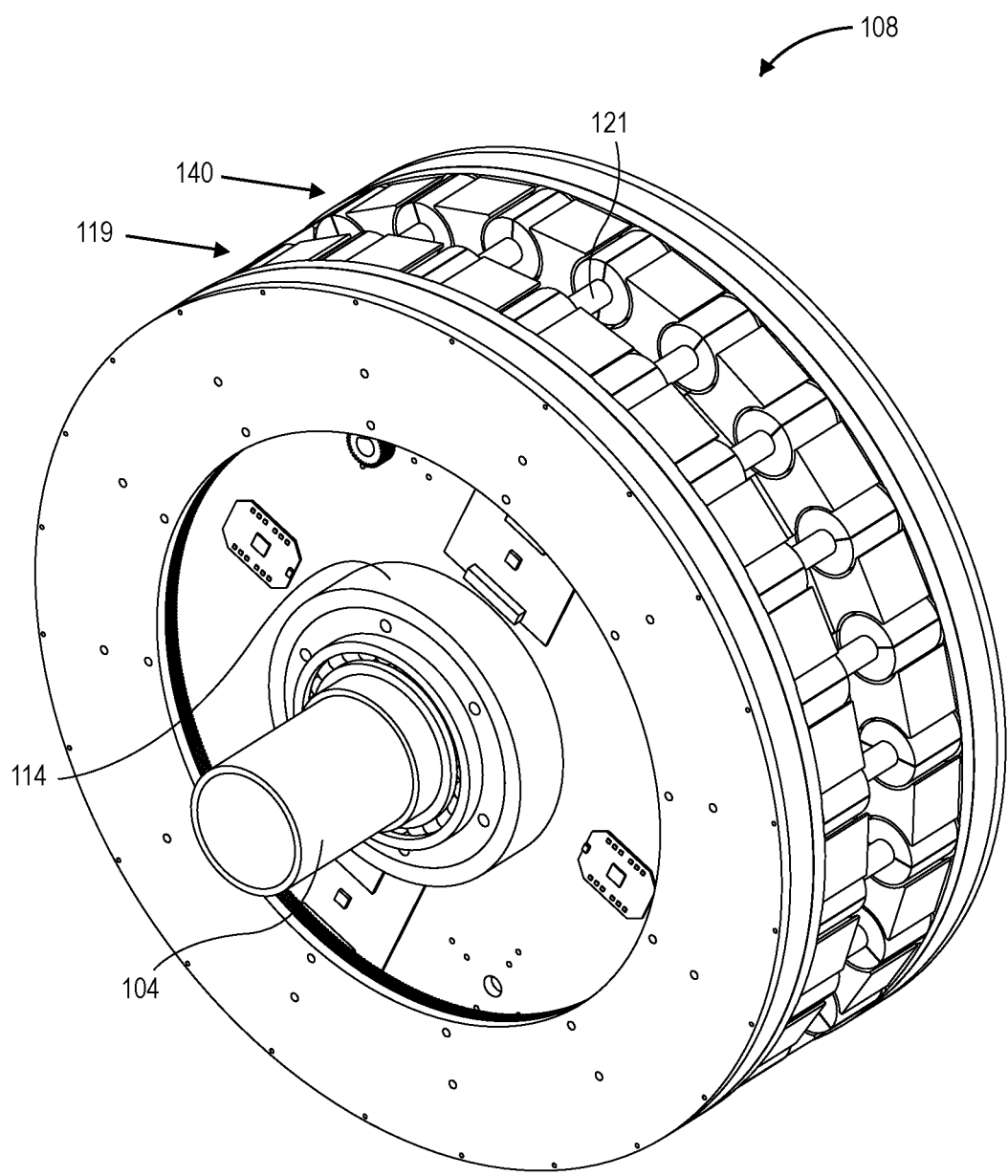
FIG. 7 is a perspective view illustrating the rotor assembly of the electric machine in FIG. 6, arranged in a Halbach array in accordance with an example embodiment of the present disclosure.
Figure 8:
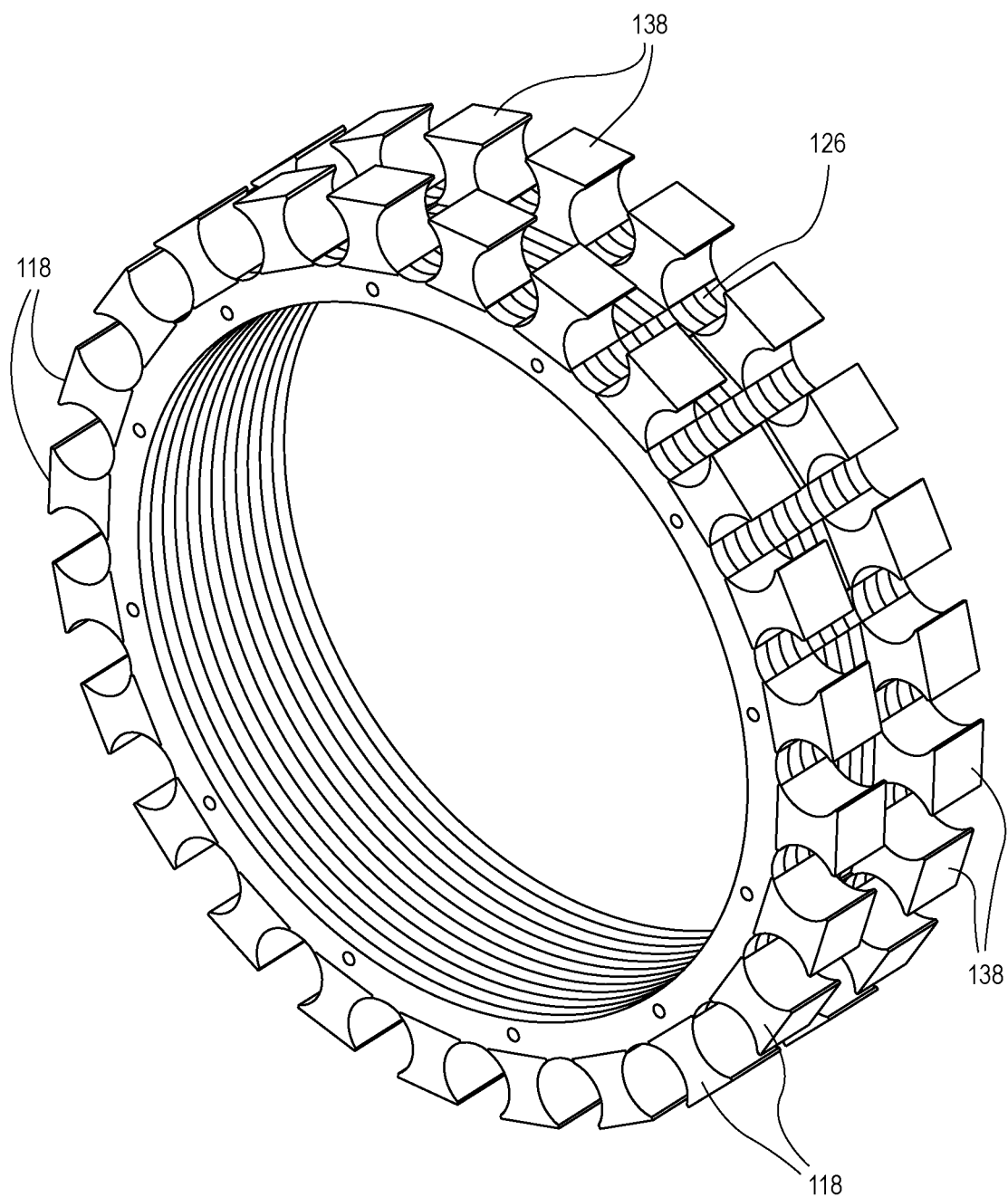
FIG. 8 is a perspective view of fixed magnets of the Halbach array of the rotor shown in FIG. 6 in accordance with example embodiments of the present disclosure.

As shown in FIGS. 3 through 5, the electric machine 100 includes a housing 102, a main axle 104, a stator assembly 106, and a rotor assembly 108. The housing 102 comprises a stator chamber 103. The main axle 104 is disposed in the housing 102 and is rotatably connected to the housing 102, for example, for example via one or more bearings that support the axle 104. The stator assembly 106 is also disposed within the housing 102. The stator assembly comprises a stator core 110 supporting a plurality of windings 112. FIGS. 6 and 7 show the rotor assembly 108. The rotor assembly 108 is coupled to the main axle 104, and is configured to rotate with respect to the stator assembly 106 to turn the main axle 104. The rotor assembly 108 comprises a rotor core 114, a first magnet assembly 116, and a second magnet assembly 117.

Figure 10:
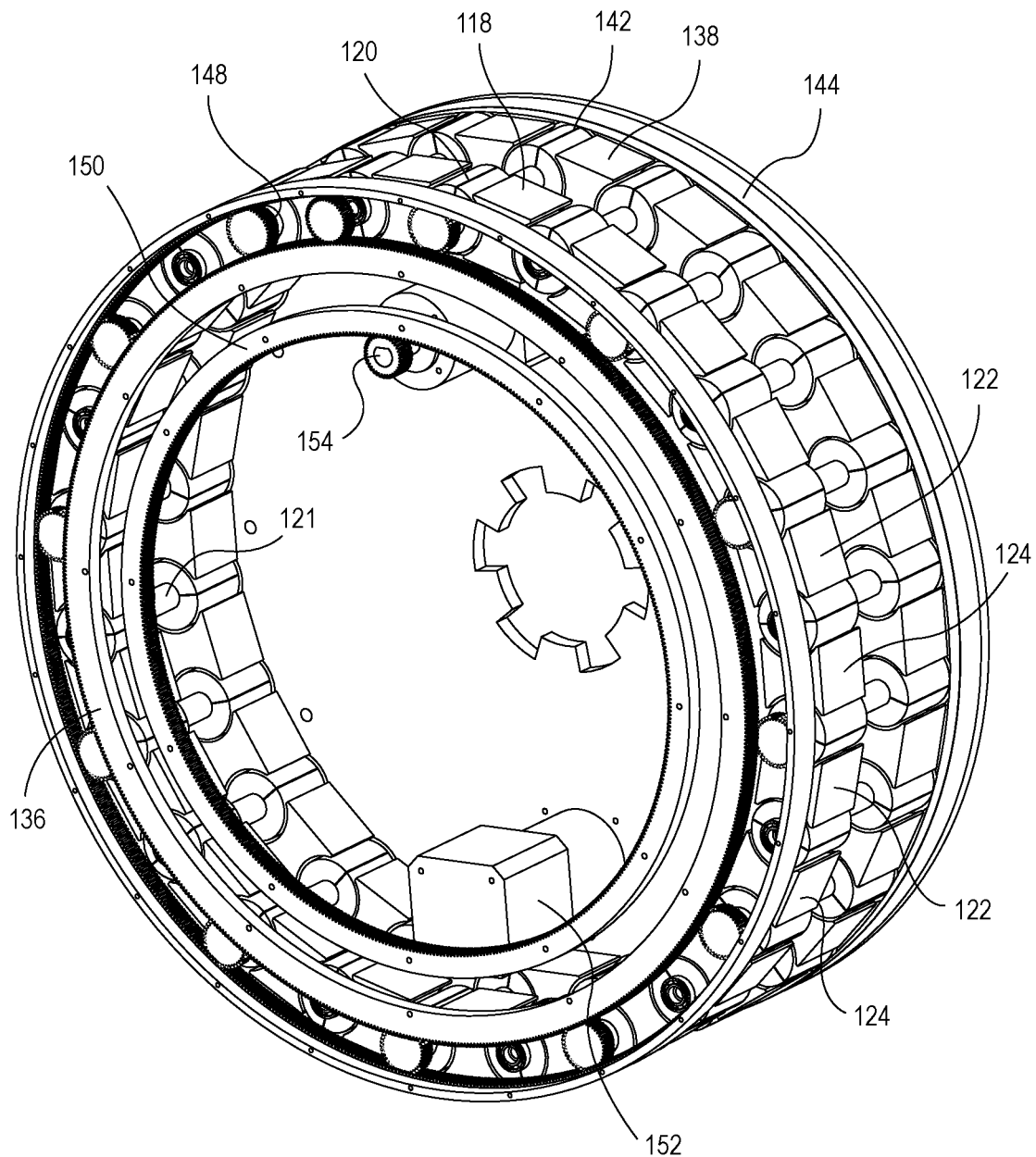
FIG. 10 is a perspective view of the rotor assembly shown in FIG. 6, showing a magnet assembly and drive assemblies to rotate rotatable magnets within the magnet assembly in accordance with example embodiments of the present disclosure.

As shown in FIG. 10, the first magnet assembly 116 includes a first plurality of fixed magnets 118 disposed in a first ring arrangement 119, and a first plurality of rotatable magnets 120. In the embodiment illustrated, the fixed magnets 118 have a generally semi-hourglass shape or cross-section (e.g., an I-shaped cross-section). As shown, the I-shaped fixed magnets 118 have concavely curved interior sides so that slots 126 are formed between adjacent ones of the fixed magnets 118 about the periphery of the rotor assembly 108. Each of the fixed magnets 118 comprise a north pole 122 and a south pole 124. Adjacent fixed magnets 118 are separated by a respective one of the slots 126. Each of the fixed magnets 118 is mounted to the rotor core 114 and oriented so that its north pole is faced either outward toward the stator assembly 106 and away from the rotor core 114 or inward toward the rotor core 114 and away from stator assembly 106, while its corresponding south pole is faced in the opposite direction, that is, inward toward the rotor core 114 and away from the stator assembly 106 or outward toward the stator assembly 106 and away from rotor core 114. The differently oriented fixed magnets 118 are disposed in an alternating arrangement about the rotor core 114 so that fixed magnets 118 having their north pole facing the stator assembly 106 are interspaced between fixed magnets 118 having their south poles facing the stator assembly 106.

Figure 17:
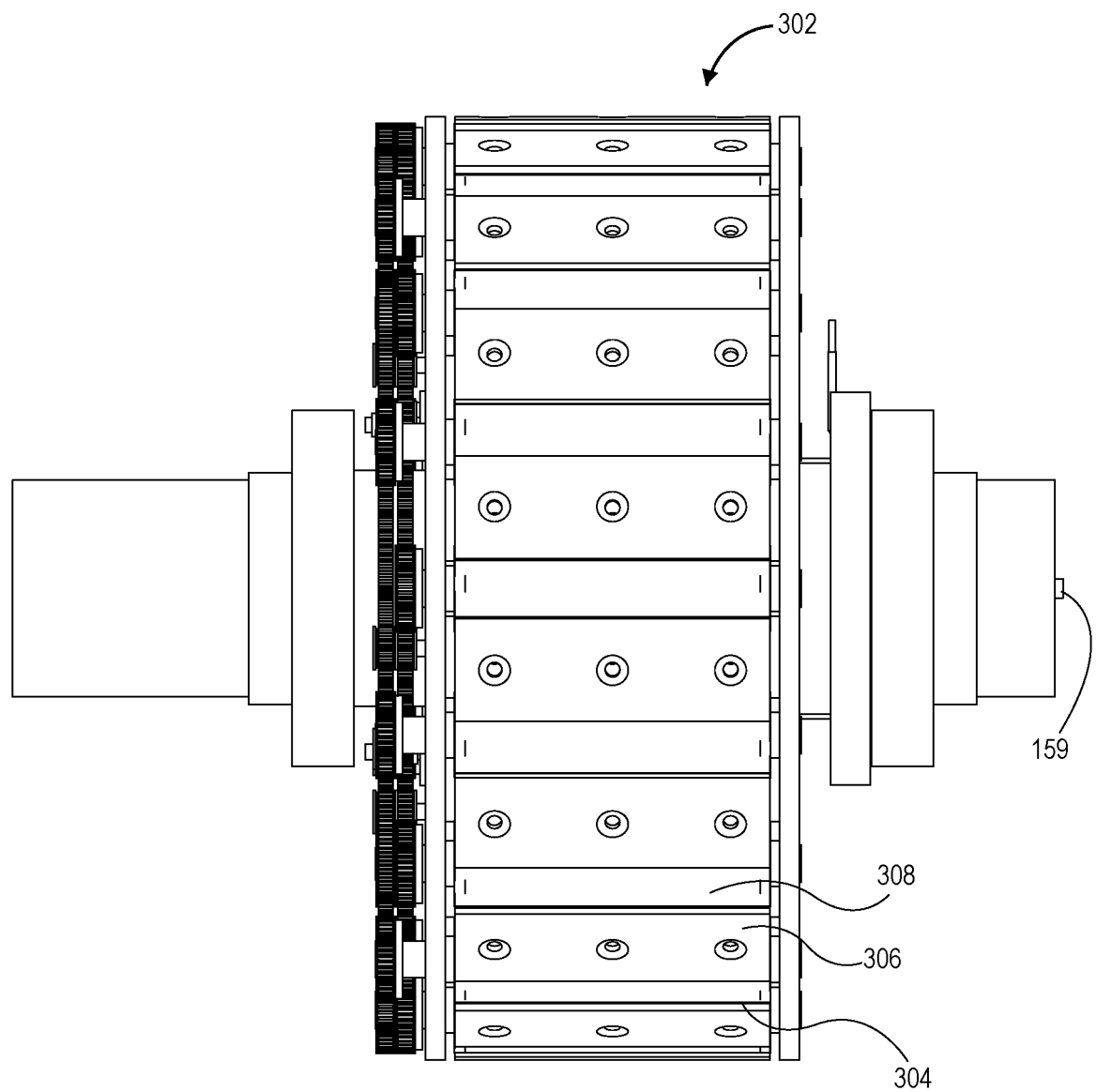
FIG. 17 is a side view illustrating the rotor assembly of the electric machine in FIG. 15, arranged in a Halbach array having one set of rotatable magnets in accordance with an example embodiment of the present disclosure.
Figure 18:
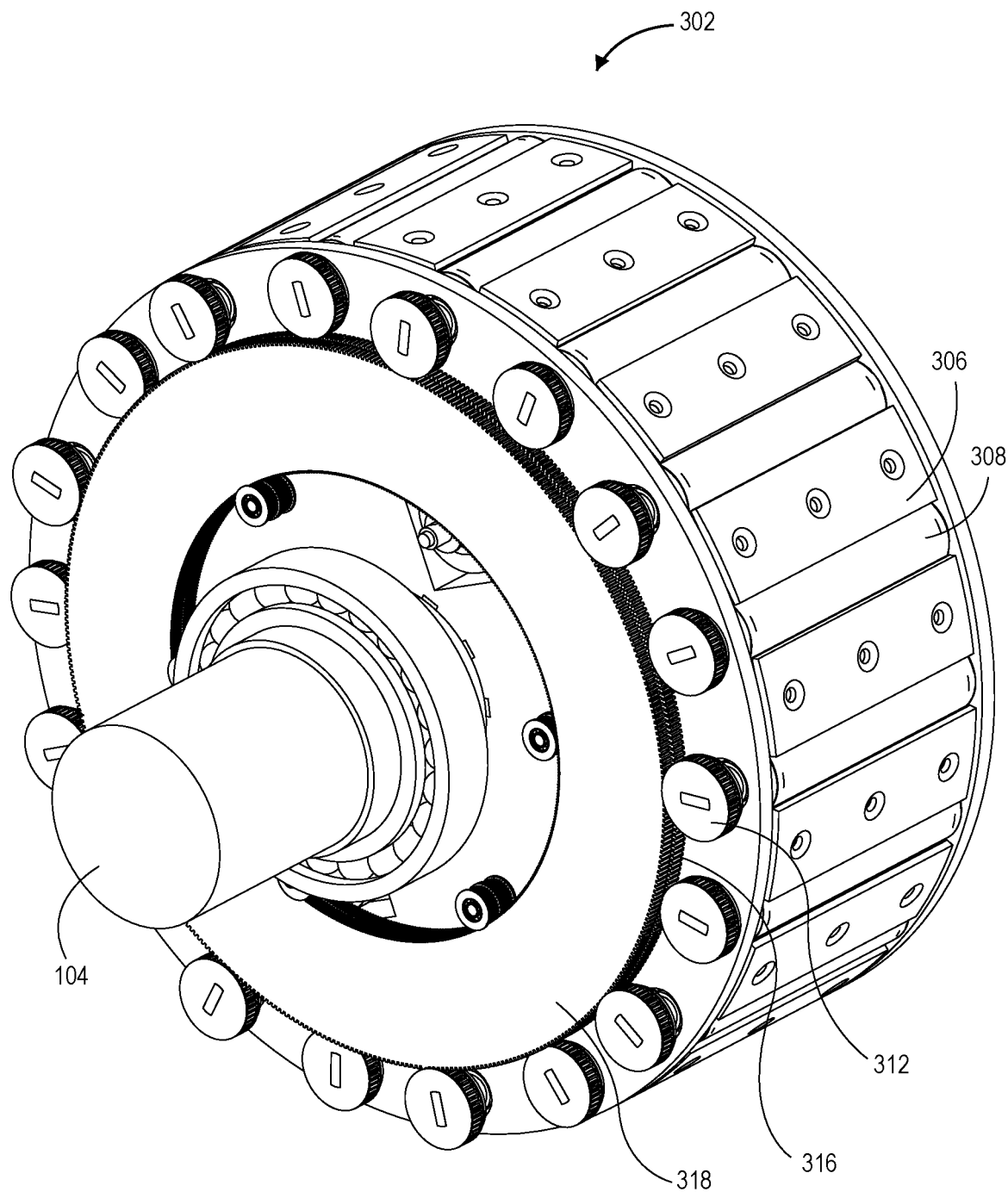
FIG. 18 is a perspective view of the rotor assembly shown in FIG. 15, showing a main axle, a magnet assembly and drive assembly to rotate rotatable magnets within the magnet assembly in accordance with example embodiments of the present disclosure.

Each of the plurality of rotatable magnets 120 are disposed within a respective slot 126 between two adjacent fixed magnets 118. In the embodiment illustrated, the rotatable magnets 120 comprise a generally cylindrical body having a first end 128 and a second end 130. The cylindrical body of each rotatable magnet 120 comprises a first half cylinder 132 and a second half cylinder 134 extending from the first end 128 to the second end 130 of the cylindrical body of the rotatable magnet 120. The first and second half cylinders, 132 and 134, respectively, correspond to the north pole of the rotatable magnet 120 and the south pole of the rotatable magnet 120. In embodiments, the rotatable magnets 120 may be single piece magnets extending the length of the stator 106, as shown in FIG. 17, or comprised of multiple rotatable magnets coupled together by an axle 121, the multiple rotatable magnets having their poles aligned in the same or a different direction.

The rotor assembly 108 further includes a first drive assembly 136 for turning the rotatable magnets 120 within the slots 126 between the fixed magnets 118, causing the magnetic field generated by the magnet assembly to vary. In the embodiment illustrated, the rotatable magnets 120 are affixed to an axle 121 extending through the longitudinal center of the rotatable magnets 120 for the length of the rotor assembly 108 and sufficiently beyond the end of the rotor assembly 108 to accommodate an axle gear 123 on at least one end of the axle 121. In other embodiments, the axles 121 may be replaced or supplemented with other gears, bearings, or bushings fixedly connected to the first end 128 and second end 130 of rotatable magnets 120.

Bearings or bushings connecting the axles 121 to the rotatable magnets 120 may be mounted on a non-magnetic plate on either end of the rotor assembly 108, or at intermittent intervals over the length of the rotor. Other embodiments of the rotor assembly 108 may use a synthetic polymer, including but not limited to polytetrafluoroethylene (PTFE) or Teflon™, to line the inner surface of the round space between the first half cylinder 132 and the second half cylinder 134 of rotatable magnets 120 to minimize friction between the rotatable magnets 120 and the axles 121.

Figure 11:
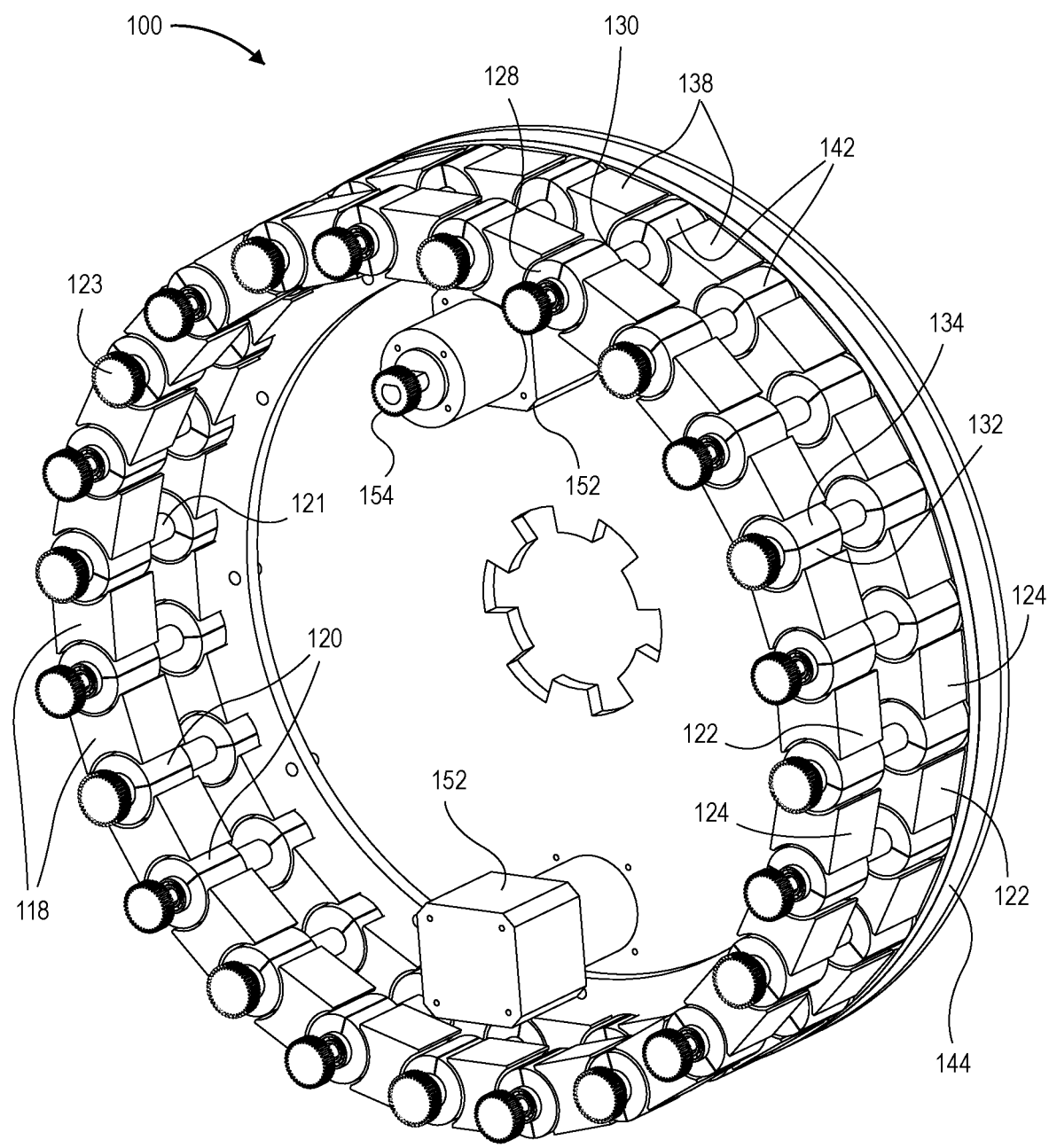
FIG. 11 is a perspective view of the rotor assembly shown in FIG. 10, further showing the magnet assembly and drive assemblies in accordance with example embodiments of the present disclosure.
Figure 12:
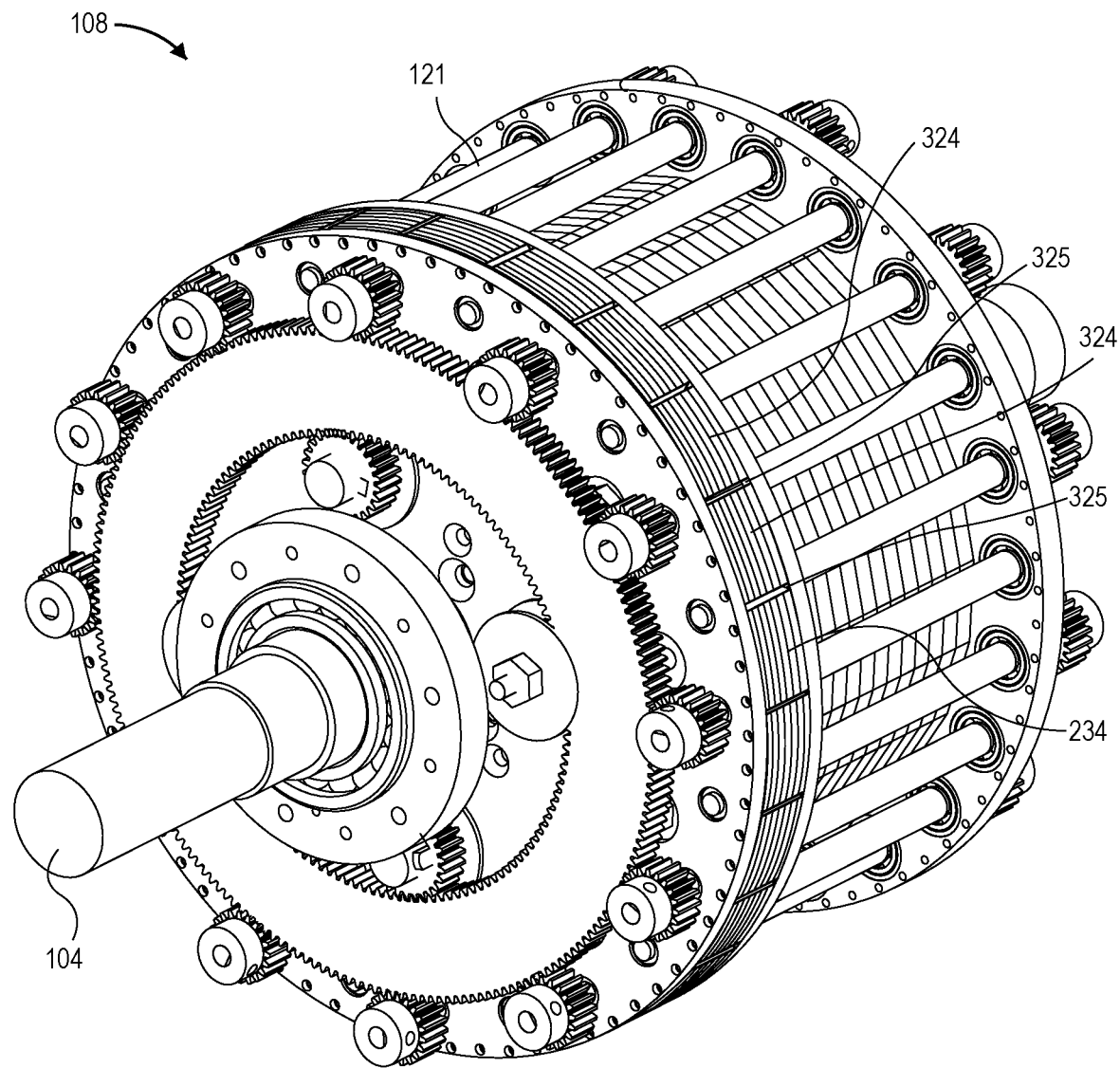
FIG. 12 is a perspective view of a different embodiment of the rotor assembly, shown in FIG. 2, having a drive assembly and magnet-securing caps around the periphery of the magnet assembly in accordance with example embodiments of the present disclosure.

The drive assembly turns the rotatable magnets in a first direction (e.g., clockwise) between a first position, shown in FIGS. 10 and 11, where the magnetic field in the rotor or stator is increased or augmented and a second position (not shown) where the magnetic field in the rotor or stator is cancelled. Rotating the north pole 132 of a rotatable magnet 120 towards the center of a fixed magnet's north pole 122 facing outwards away from the rotor core 114 increases the magnetic field of the rotor assembly 108. In contrast, rotating the north pole 132 of a rotatable magnet 120 towards the center of a fixed magnet's south pole 124 facing outwards of the rotor core 114 decreases the strength of the magnetic field to zero or near zero (e.g., zero (0) or near zero (0) gauss). Because the magnetic field of the rotor assembly 108 can be varied over a wide range of magnetic field strength (gauss) output, the application requirements can be met in a more efficient way compared to the prior art. The rotation of rotatable magnets 120 can be reversed in increments up to 180 degrees so that the respective north poles 132 and south poles 134 of the rotatable magnets 120 face the radial planes of opposing-pole fixed magnets.

FIGS. 10 and 11 also show the second magnet assembly 117 having a second plurality of fixed magnets 138 disposed in a second ring arrangement 140, and a second plurality of rotatable magnets 142. In the embodiment illustrated, the fixed magnets 138 have a generally semi-hourglass shape or cross-section (e.g., an I-shaped cross-section). As shown, the I-shaped fixed magnets 138 have concavely curved interior sides so that slots 126 are formed between them. Each of the fixed magnets 138 comprise a north pole 122 and a south pole 124 and are divided by a respective one of the slots 126. Each of the fixed magnets 138 is mounted to the rotor core 114 and oriented so that its north pole is faced either outward toward the stator assembly 106 and away from the rotor core 114 or inward toward the rotor core 114 and away from stator assembly 106, while its corresponding south pole is faced in the opposite direction, that is, inward toward the rotor core 114 and away from the stator assembly 106 or outward toward the stator assembly 106 and away from rotor core 114, are disposed within a respective slot 126 between two adjacent fixed magnets 138. The rotatable magnets 142 comprise a generally cylindrical body having a first end 128 and a second end 130. The cylindrical body of a rotatable magnet 142 comprises a first half cylinder 132 and a second half cylinder 134 extending from the first end to the second end of the cylindrical body of the rotatable magnet. The first and second half cylinders, 132 and 134, respectively correspond to the north pole and the south pole of the rotatable magnet.

The second magnet assembly 117 further includes a second drive assembly 144 for turning the second plurality of rotatable magnets 142 within the slots 126 between the second plurality of fixed magnets 138, allowing the magnetic field generated by the second magnet assembly 117 to vary. The second drive 144 assembly turns the rotatable magnets 142 counterclockwise between a first position where the magnetic field is increased and a second position where the magnetic field in the rotor or stator is cancelled. Rotating the north pole of a rotatable magnet 142 towards the central radial plane of a fixed north pole magnet 122 facing outwards of the rotor core 114 increases the magnetic field of the electric machine 100. In contrast, rotating the north pole of a rotatable magnet 142 towards the central radial plane a fixed south pole magnet 124 facing outwards of the rotor core 114 decreases the strength of the magnetic field to near zero (e.g., near zero (0) gauss), allowing the rotor assembly 108 to vary the magnetic field over a wide range of gauss output. The rotation of rotatable magnets 142 can be reversed in increments up to 180 degrees so that the respective north and south poles of the round magnets face the radial planes of opposing-pole fixed magnets.

In the present embodiment, the first magnet assembly 116 and the second magnet assembly 117 are adjacent to one another. The first magnet assembly and the second magnet assembly are arranged in alternating order. The first plurality of fixed magnets 118 having a north pole 122 facing outwardly towards the stator assembly 106 are adjacent to fixed magnets of the second plurality of fixed magnets 138 having a south pole 124 facing outwardly towards the stator assembly 106. Similarly, fixed magnets of the first plurality of magnets 118 having a south pole 124 facing towards the stator assembly 106 are adjacent to fixed magnets of the second plurality of fixed magnets 138 having a north pole 122 facing toward the stator assembly 106.

FIGS. 10 and 11 illustrate the rotatable magnets of the first plurality of rotatable magnets 120 being coupled to the rotatable magnets of the second plurality of rotatable magnets 142, forming a plurality of rotatable magnet assemblies 146. The rotatable magnet assemblies have a first side 132 and a second side 134. Rotatable magnets from the first plurality of rotatable magnets 120 may have the magnetic north pole disposed at the first side 132 of the rotatable magnet assembly, and a south pole disposed at the second side 134 of the rotatable magnet assembly. Rotatable magnets from the second plurality of rotatable magnets 142, may have a south pole disposed at the first side 132 of the rotatable magnet assembly and a north pole disposed at the second side 134 of the respective magnet assembly. Every other rotatable magnet assembly may be positioned at a rotation angle of 180 degrees with respect to the next rotatable magnet assembly along the ring arrangements 119 and 140 of the rotor assembly 108.

In an embodiment, each one of the first and second rotatable magnet assemblies 120 and 142 include a drive assembly having a planetary gear 148. The respective first and second drive assemblies 136 and 144 also comprise a ring gear 150 engaged to a motive device 152 through a drive gear 154. The motive device 152 can be a stepper motor, a hydraulic piston, or any other radial or linear motion device known in the art. Different embodiments of the present invention may include more than one motive devices on each side of the rotor assembly. The ring gear 150 is connected to the planetary gear 148. As seen on FIG. 10 the motive device 152 turns the drive gear 154 which rotates the ring gear 150 to turn the planetary gear 148. The planetary gear 148 enables each respective rotatable magnet assemblies to turn the plurality of rotatable magnets 120 and 146 within the slots 126 between the plurality of rotatable fixed magnets 118 and 138. In alternative embodiments, the axle gears 123 at the ends of rotatable magnets 120 may be turned by other transmission means other than ring gears, including but not limited to meshing all round axle gears 123 together so that the alternate rotatable magnets 120 on either side of the fixed magnets 118 rotate clockwise and counter-clockwise in alternating order.

The main axle 104 may shaped to support one or more motive devices 152. Motive devices 152 may be positioned facing forward and facing backwards parallel in respect to the longitudinal axis of main axle 104, depending on the number of motive devices 152 used in different embodiments of electric machine 100. The main axle 104 may also support different electronic devices used to control the one or more motive devices, such as but not limited to Printed Circuit Boards (PCB), power converters, combinations thereof, and so forth. The main axle 104 may also include a rotational position indicator which may be positioned at an end of the main axle 104.

Figure 13:
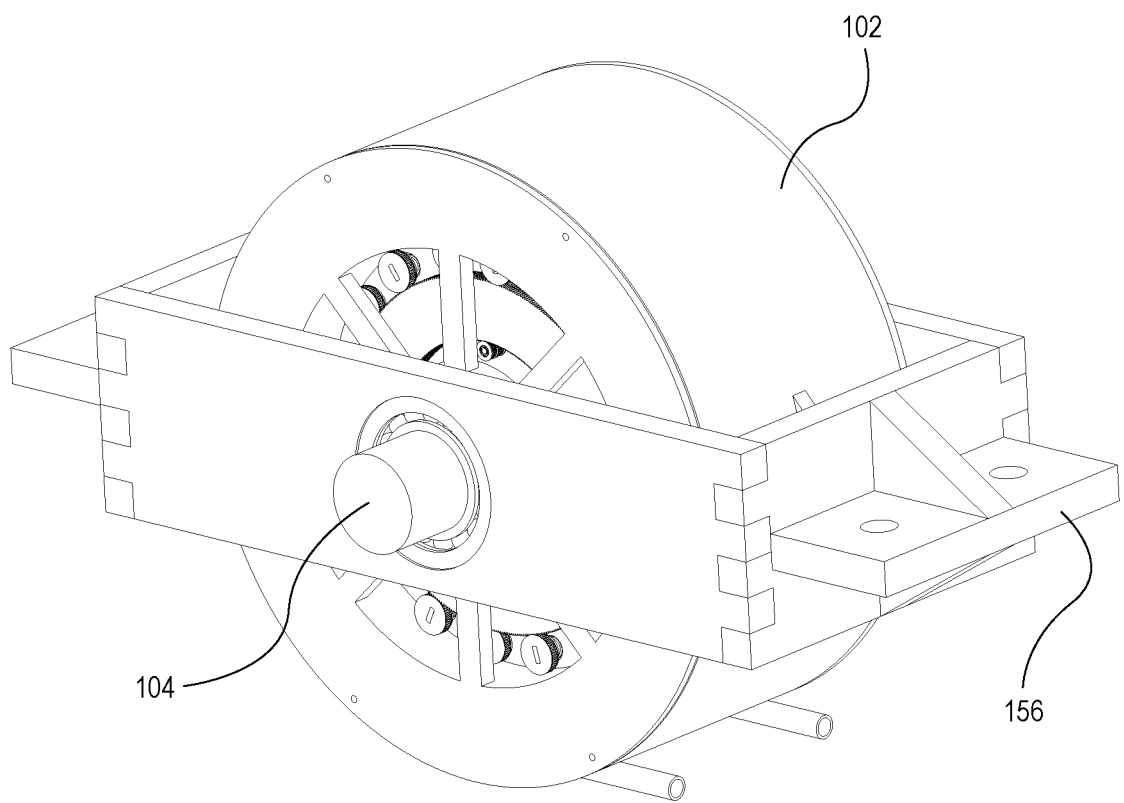
FIG. 13 is a perspective view of another embodiment of the electric machine, in accordance with an example embodiment of the present disclosure.
Figure 14:
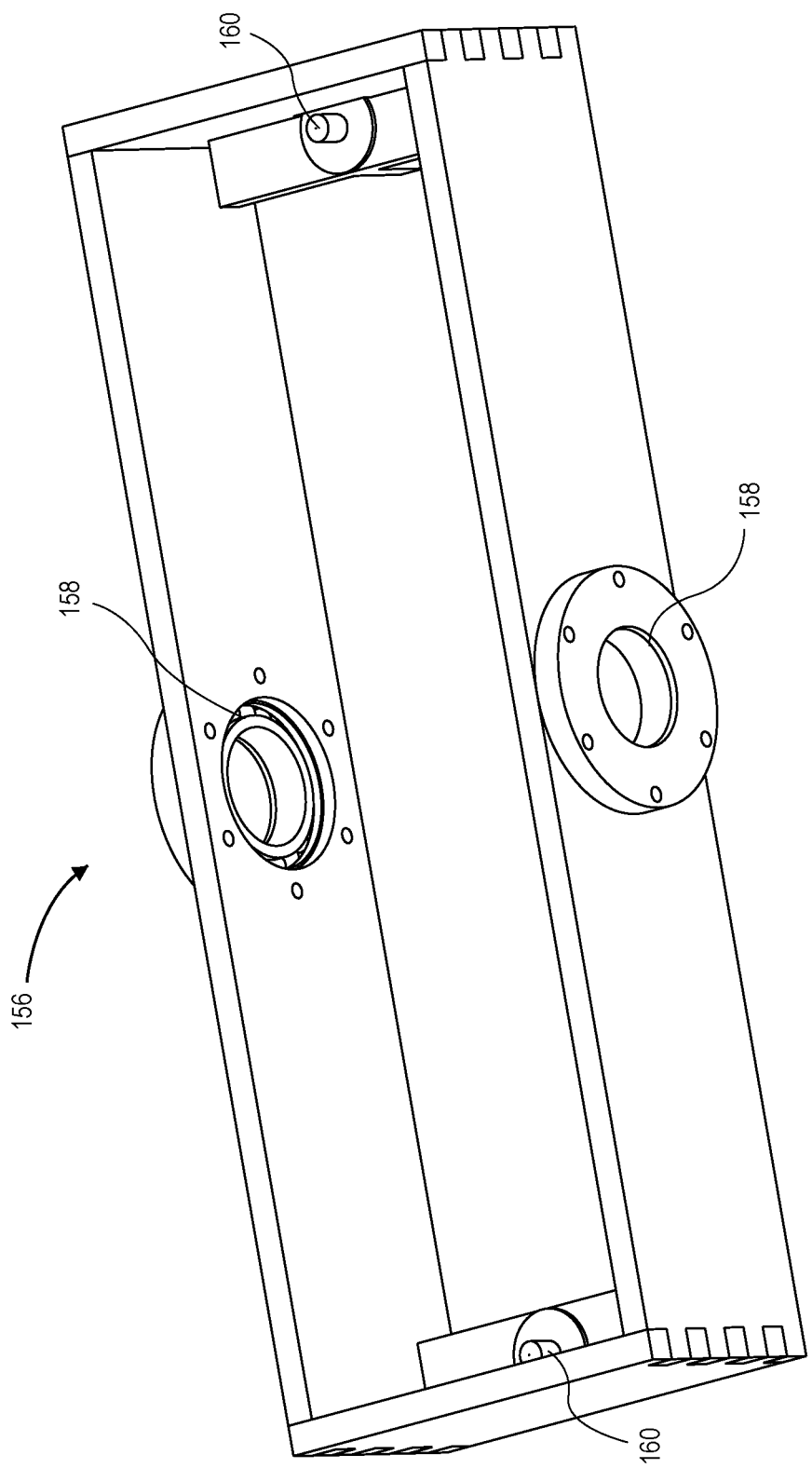
FIG. 14 is a perspective view of a mounting bracket shown in FIG. 13 having torque sensors in accordance with example embodiments of the present disclosure.

FIG. 13 shows a different embodiment of the housing 102 inside a mounting bracket 156. The mounting bracket 156, shown in FIG. 14, is rotatably connected to the main axle 104 by means of bearings 158 at both sides of the main axle 104. This configuration allows the housing 102 to have free rotational movement in reference to the mounting bracket 156. The axle 104 includes an end cap 157 having a position sensor 159 and a wireless communication device. The position sensor 159 measures the RPM of the electric machine, and the wireless communication device communicates and transmits commands to each motive device 152. Another possible configuration of the mounting bracket 156 includes but is not limited to a completely closed shroud. This enclosed shroud mounting bracket (not shown) would protect the electric machine from environmental contaminants and weather conditions.

As shown in FIG. 14, the mounting bracket 156 may include torque sensors such as but not limited to two load cells 160 mounted on either side of the electric machine housing 102. The load cells 160 may measure tension or compression to determine the torque of the electric machine in either direction. This torque measurement may be used in addition to other measured parameters (e.g., rpm, etc.) to determine the power input or output of the electric machine 100.

Figure 19:
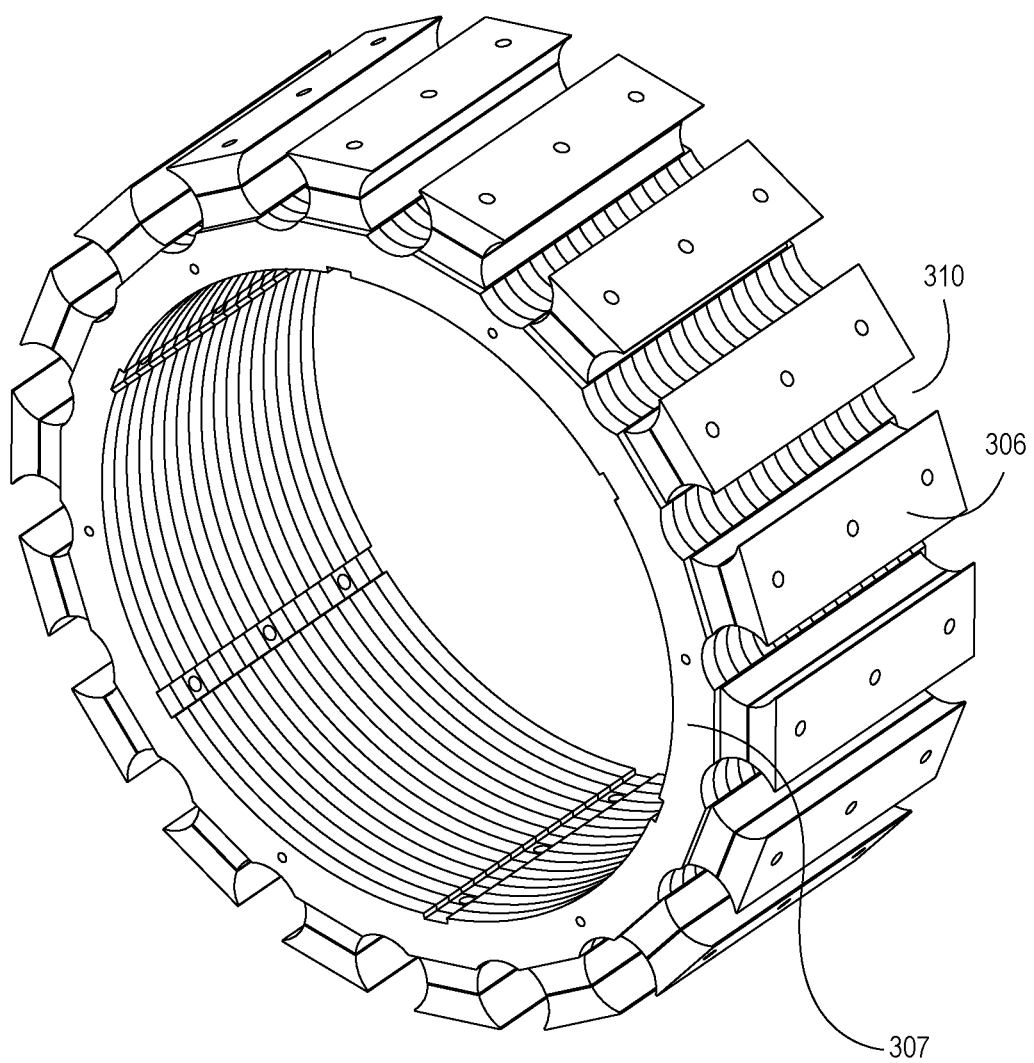
FIG. 19 is a perspective view of fixed magnets of the Halbach array of the rotor shown in FIG. 18 in accordance with example embodiments of the present disclosure.
Figure 20:
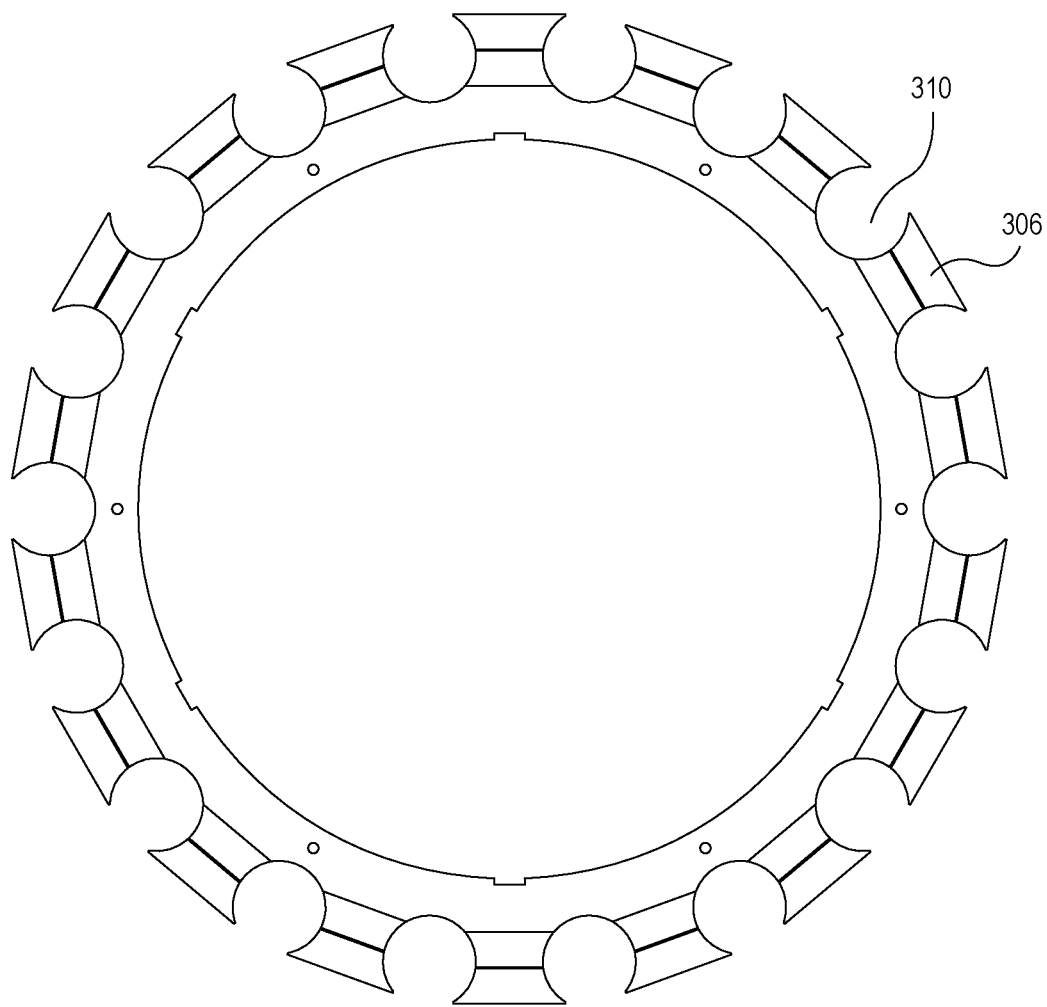
FIG. 20 is a side view of fixed magnets of the Halbach array of the rotor shown in FIG. 18 in accordance with example embodiments of the present disclosure.

A second embodiment of the electric machine 100 is illustrated in FIGS. 13 through 22. In this second embodiment of the electric machine, the rotor 302 includes a single magnet assembly 304. FIGS. 19 and 20 show a plurality of fixed magnets 306. The I-shaped fixed magnets are arranged around the perimeter of a rotor ring and are fixed to a conventional laminated plate 307. Each fixed magnet 306 comprises a north pole and a south pole, alternately facing radially outward from the central axis of the rotor 302 around the perimeter of the rotor ring. A plurality of rotatable magnets 308 are located within slots 310 between the fixed magnets 306. The slots 310 may be coated with a friction-reducing coating such as a Teflon™ or Delrin™ type material or other polymers that reduce friction between surfaces.

The rotatable magnets 308 on either side of a fixed magnet 306 are designed to be rotated in the opposite direction from one another, preferably but not limited to approximately 180 degrees. The rotatable magnets 308 are rotated by means of a sprocket 312 fixedly connected to the end of the rotatable magnets. Including the sprockets 312, the drive assembly 314 also includes two ring gears 316 and 318, and motive devices 320. Each one of the ring gears 316 and 318 comprise teeth on its outer circumference, respectively turning the sprockets 312 on every other rotatable magnet 308. In this embodiment the first ring gear 316 turns the first set of rotatable magnets clockwise, while the second ring gear 318 rotates the second set of rotatable magnets counter-clockwise. The ring gears 316 and 318 are in turn rotatably connected to a respective motive device 320 by means of teeth around the inner circumference of each ring gear. A different embodiment may change the direction of rotation for the first and second ring gears.

Figure 9:
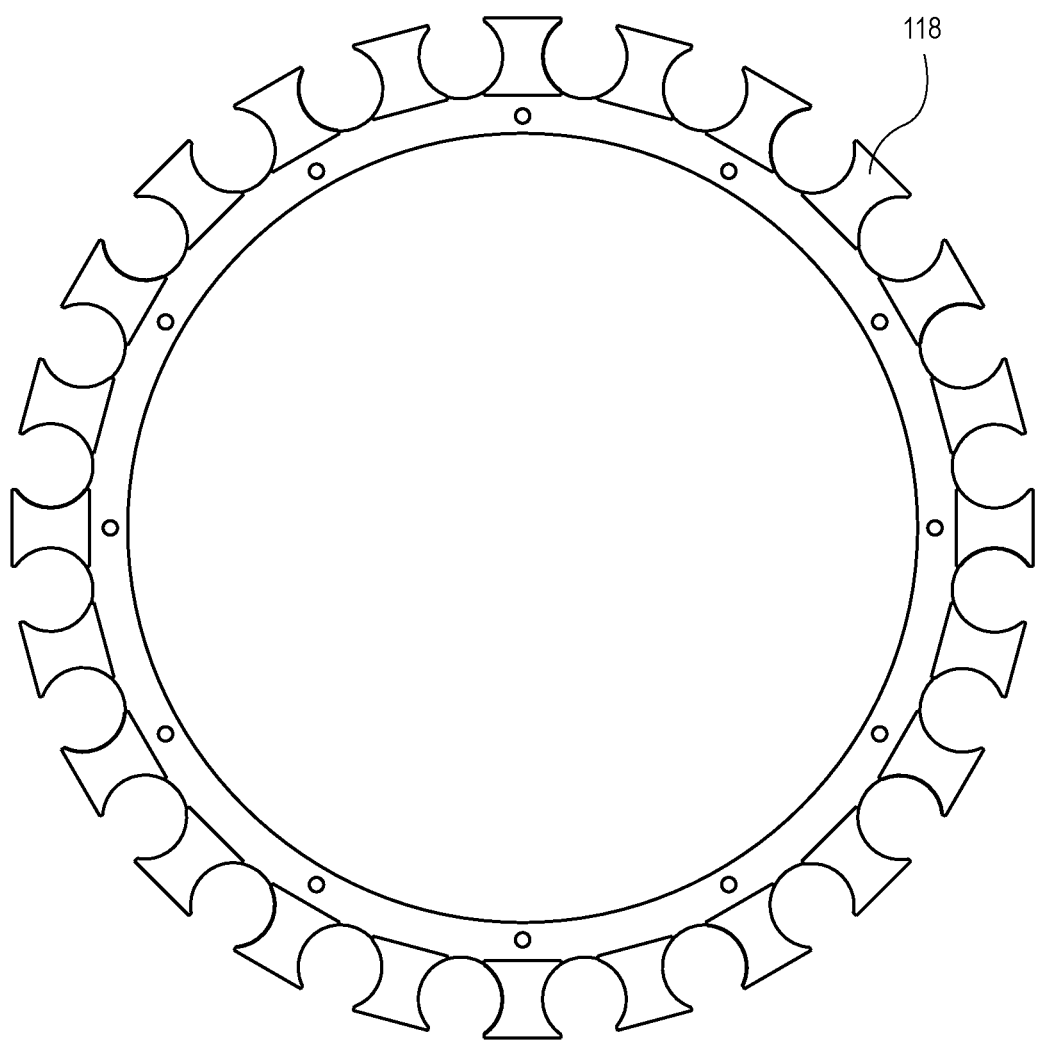
FIG. 9 is a front view of fixed magnets of the Halbach array of the rotor shown in FIG. 6 in accordance with example embodiments of the present disclosure.

The embodiments referenced in this disclosure may include a magnetic metal laminate around the rotor core 322 as magnet-securing caps 324 to secure the pluralities of fixed magnets to the rotor rings, as shown in FIG. 9. The magnet-securing caps 324 may be tangentially separated from each other by a gap 325 to focus the variable strength of the magnetic field of the combined rotor assembly 108 radially outwards towards the stator assembly 106. In different embodiments, the magnet securing caps may be positioned continuously between the north and south poles, and not separated by a gap. The magnetic metal laminate may be magnetic iron but could be made of a different ferromagnetic material. The stator core material may be magnetic iron, another magnetic material, a non-magnetic material (e.g., aluminum, etc.) or any combination of magnetic and non-magnetic materials.

The stator core material may be magnetic iron, another magnetic material, a non-magnetic material (e.g., aluminum, etc.) or any combination of magnetic and non-magnetic materials. Different embodiments of the present invention may include a metallic casing 326 around the pluralities of rotatable magnets. The casing 326 may be made from stainless steel or other metallic alloys.

In other embodiments, the electric machine 100 may include fixed magnets of different depths, shapes, and sizes. The fixed magnets in other embodiments may also be spaced-apart at different distances from one other to fit the rotatable magnets between them to produce a variable magnetic field and desired induction of electric current in the stator coils. In other embodiments the rotatable magnets may be cylindrical in shape, having a diameter relative to the depth of the fixed magnets that will produce a variable magnetic field and desired induction of electric current in the stator coils.

In other embodiments, the electric machine 100 may include a rotor disposed within the housing having a rotor core supporting a plurality of windings. The rotor assembly may be coupled to a main axle, and may be configured to rotate with respect to a stator assembly. The stator assembly may comprise a stator core, having at least one magnet assembly, the at least one magnet assembly having a tunable Halbach array configuration in accordance with the present disclosure.

It is to be understood that the term "stator" is used herein to describe an element of the electric machine where the wire coils are located into which electric current is induced by the magnetic field of the permanent magnets or is fed an electric current by other sources to produce a magnetic field EMF to interact with the magnetic field of the permanent magnets. This could be a motor, a generator, or a linear motor including linear induction motors.

Although the subject matter has been described in language specific to structural features and/or process operations, it is to be understood that the subject matter defined in the appended claims is not necessarily limited to the specific features or acts described above. Rather, the specific features and acts described above are disclosed as example forms of implementing the claims.

What is claimed is:

1. An electric machine, comprising:
a magnet assembly for generating a magnetic field in one of a rotor or a stator, the magnet assembly comprising:
a plurality of fixed magnets disposed in a ring arrangement, the plurality of fixed magnets arranged having alternating poles facing toward the rotor or the stator, the plurality of fixed magnets defining a plurality of slots such that each slot among the plurality of slots is located between a respective fixed magnet and a respective adjacent fixed magnet among the plurality of fixed magnets; and
a plurality of rotatable magnets, each of the rotatable magnets having a north pole and a south pole, the plurality of rotatable magnets configured to rotate respectively within the plurality of slots to vary the magnetic field generated by the magnet assembly in the rotor or the stator, the plurality of rotatable magnets configured to rotate between a first position wherein the magnetic field in the rotor or the stator is augmented and a second position wherein the magnetic field in the rotor or the stator is reduced.

2. The electric machine as recited in claim 1, wherein each fixed magnet among the plurality of fixed magnets are generally I-shaped having concavely curved sides so that each slot among the plurality of slots is generally cylindrical, the plurality of fixed magnets having a respective plurality of magnet-securing caps that focus the magnetic field of the rotor towards the stator.

3. The electric machine as recited in claim 2, wherein each rotatable magnet among the plurality of rotatable magnets comprise a generally cylindrical body having a first end and a second end, the cylindrical body comprised of a first half cylinder comprising the north pole and a second half cylinder comprising the south pole, the first and second half cylinders extending from the first end to the second end.

4. The electric machine as recited in claim 1, further comprising:
a drive assembly for turning the plurality of rotatable magnets respectively within the plurality of slots, the drive assembly configured to turn the rotatable magnets between the first position and the second position, and
a second magnet assembly including:
a second plurality of fixed magnets disposed in a second ring arrangement, the second plurality of fixed magnets arranged having alternating poles facing toward the rotor or the stator the second plurality of fixed magnets defining a second plurality of slots such that each slot among the second plurality of slots is located between a respective fixed magnet and a respective adjacent fixed magnet among the second plurality of fixed magnets;
a second plurality of rotatable magnets, each rotatable magnet among the second plurality of rotatable magnets having a north pole and a south pole, the second plurality of rotatable magnets configured to rotate respectively within the the second plurality of slots to vary the magnetic field in the rotor or the stator, the second plurality of rotatable magnets configured to rotate between a first position wherein the magnetic field in the stator assembly is augmented and a second position wherein the magnetic field in the stator assembly is reduced.

5. The electric machine as recited in claim 4, wherein the second magnet assembly is adjacent to the first magnet assembly so that a first subset of fixed magnets of the plurality of fixed magnets having a north pole faced toward the stator are adjacent to a first subset of fixed magnets of the second plurality of fixed magnets having a south pole faced toward the stator and a second subset of fixed magnets of the first plurality of magnets having a south pole faced toward the stator are adjacent to a second subset of fixed magnets of the second plurality of magnets having a north pole faced toward the stator.

6. The electric machine as recited in claim 5, wherein each rotatable magnet among the plurality of rotatable magnets is coupled to a respective rotatable magnet among the second plurality of rotatable magnets, wherein each respectively coupled rotatable magnets between the plurality of rotatable magnets and the second plurality of rotatable magnets defines a rotatable magnet assembly.

7. The electric machine as recited in claim 6, wherein each rotatable magnet among the plurality of rotatable magnets is oriented opposite in magnetic polarity to the respective coupled rotatable magnet among the second plurality of rotatable magnets.

8. The electric machine as recited in claim 7, wherein each rotatable magnet assembly is positioned at a rotation of one hundred and eighty degrees with respect to an adjacent rotatable magnet assembly.

9. The electric machine as recited in claim 8, wherein the first plurality of fixed magnets and the second plurality of fixed magnets are generally I-shaped having concavely curved sides so that the respective plurality of slots and the respective second plurality of slots are generally cylindrical.

10. The electric machine as recited in claim 9, wherein each of the rotatable magnets of the first plurality of rotatable magnets and the second plurality of rotatable magnets comprise a generally cylindrical body having a first end and a second end.

11. An electric machine, comprising:
a housing;
an axle disposed in the housing, the axle supported by at least one bearing assembly so that the axle may rotate with respect to the motor housing;
a stator assembly disposed within the motor housing; and
a rotor assembly coupled to the axle and configured to rotate with respect to the stator assembly to turn the axle, the rotor assembly comprising:
a rotor core having a generally cylindrical outer face,
a magnet assembly for generating a magnetic field in the stator assembly, the magnet assembly comprising:
a plurality of fixed magnets spaced about the outer face of the rotor core in a ring arrangement, the plurality of fixed magnets arranged having alternating poles facing toward the stator assembly, the plurality of fixed magnets defining a plurality of slots such that each slot among the plurality of slots is located between a respective fixed magnet and a respective adjacent fixed magnet among the plurality of fixed magnets, and a plurality of rotatable magnets, each of the rotatable magnets having a north pole and a south pole, the plurality of rotatable magnets configured to rotate respectively within the plurality of slots to vary the magnetic field in the stator assembly, the plurality of rotatable magnets configured to rotate between a first position wherein the magnetic field in the stator assembly is augmented and a second position wherein the magnetic field in the stator assembly is reduced.

12. The electric machine as recited in claim 11, wherein each fixed magnet among the plurality of fixed magnets are generally I-shaped having concavely curved sides so that each slot among the plurality of slots is generally cylindrical.

13. The electric machine as recited in claim 12, wherein each rotatable magnet among the plurality of rotatable magnets comprise a generally cylindrical body having a first end and a second end, the cylindrical body comprised of a first half cylinder comprising the north pole and a second half cylinder comprising the south pole, the first and second half cylinders extending from the first end to the second end.

14. The electric machine as recited in claim 11, further comprising:
a drive assembly for turning the plurality of rotatable magnets respectively within the plurality of slots, the drive assembly configured to turn the rotatable magnets between the first position and the second position, and
a second magnet assembly including:
a second plurality of fixed magnets spaced about the outer face of the rotor core in a second ring arrangement, the second plurality of fixed magnets arranged having alternating poles facing toward the stator assembly, and the second plurality of fixed magnets forming a second plurality of slots such that each slot among the second plurality of slots is located between a respective fixed magnet and a respective adjacent fixed magnet among the second plurality of fixed magnets;
a second plurality of rotatable magnets, each rotatable magnet among the second plurality of rotatable magnets having a north pole and a south pole, the second plurality of rotatable magnets configured to rotate respectively within the the second plurality of slots;
wherein the drive assembly is configured for turning the second plurality of rotatable magnets respectively within the second plurality of slots to vary the magnetic field in the stator assembly, the drive assembly configured to turn the second plurality of rotatable magnets between a first position wherein the magnetic field in the stator assembly is augmented and a second position wherein the magnetic field in the stator assembly is reduced.

15. The electric machine as recited in claim 14, wherein each of the rotatable magnets among the plurality of rotatable magnets and the second plurality of rotatable magnets comprise a planet gear, and wherein the drive assembly comprises a ring gear engaged with the planet gears and a motive device having a drive gear engaged with the ring gear, wherein the motive device turns the drive gear, rotating the ring gear to turn the planet gear.

16. The electric machine as recited in claim 14, wherein the second magnet assembly is adjacent to the magnet assembly so that a first subset of fixed magnets of the plurality of fixed magnets having a north pole faced toward the stator assembly are adjacent to a first subset of fixed magnets of the second plurality of fixed magnets having a south pole faced toward the stator assembly and a second subset of fixed magnets of the plurality of magnets having a south pole faced toward the stator assembly are adjacent to a second subset of fixed magnets of the second plurality of magnets having a north pole faced toward the stator assembly.

17. The electric machine as recited in claim 16, wherein each rotatable magnet among the plurality of rotatable magnets is coupled to a respective rotatable magnet among the second plurality of rotatable magnets, wherein each respectively coupled rotatable magnets between the plurality of rotatable magnets and the second plurality of rotatable magnets defines a rotatable magnet assembly.

18. The electric machine as recited in claim 17, wherein each rotatable magnet among the plurality of rotatable magnets is oriented opposite in magnetic polarity to the respective coupled rotatable magnet among the second plurality of rotatable magnets.

19. The electric machine as recited in claim 18, wherein each rotatable magnet assembly is positioned at a rotation of one hundred and eighty degrees with respect to an adjacent rotatable magnet assembly.

20. The electric machine as recited in claim 19, wherein the plurality of fixed magnets and the second plurality of fixed magnets are generally I-shaped having concavely curved sides so that the respective plurality of slots and the respective second plurality of slots are generally cylindrical, and wherein respective ones of the rotatable magnets of the first plurality of rotatable magnets and the second plurality of rotatable magnets comprise a generally cylindrical body having a first end and a second end.

* * * * *